(12) United States Patent
Kasaoka et al.

(10) Patent No.: US 7,696,081 B2
(45) Date of Patent: Apr. 13, 2010

(54) METHOD OF MANUFACTURING SEMICONDUCTOR DEVICE THAT USES BOTH A NORMAL PHOTOMASK AND A PHASE SHIFT MASK FOR DEFINING INTERCONNECT PATTERNS

(75) Inventors: Tatsuo Kasaoka, Tokyo (JP); Kiyohiko Sakakibara, Tokyo (JP); Noboru Mori, Tokyo (JP); Kazunobu Miki, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 172 days.

(21) Appl. No.: 12/010,793

(22) Filed: Jan. 30, 2008

(65) Prior Publication Data

US 2008/0217786 A1    Sep. 11, 2008

(30) Foreign Application Priority Data

Jan. 31, 2007    (JP)    ............................. 2007-021732

(51) Int. Cl.
*H01L 21/475*    (2006.01)
(52) U.S. Cl. .................. 438/612; 438/637; 438/926; 257/E21.488
(58) Field of Classification Search .............. 438/926; 257/E21.488
See application file for complete search history.

(56) References Cited

U.S. PATENT DOCUMENTS

| | | | | |
|---|---|---|---|---|
| 5,879,839 A * | 3/1999 | Jung et al. | ..................... | 430/5 |
| 5,998,068 A * | 12/1999 | Matsuoka | ....................... | 430/5 |
| 6,333,213 B2 * | 12/2001 | Hasebe et al. | ............... | 438/129 |
| 6,660,462 B1 * | 12/2003 | Fukuda | ....................... | 430/394 |
| 6,902,852 B2 * | 6/2005 | Watanabe | ....................... | 430/5 |
| 2005/0255387 A1 * | 11/2005 | Butt et al. | ....................... | 430/5 |
| 2006/0125118 A1 * | 6/2006 | Yamazaki | ................... | 257/784 |

FOREIGN PATENT DOCUMENTS

| | | |
|---|---|---|
| JP | 6-282063 | 10/1994 |
| JP | 8-306615 | 11/1996 |
| JP | 9-179287 | 7/1997 |
| JP | 10-73914 | 3/1998 |
| JP | 10-83062 | 3/1998 |
| JP | 10-178015 | 6/1998 |
| JP | 11-307601 | 11/1999 |
| JP | 2003-114514 | 4/2003 |

(Continued)

*Primary Examiner*—Stephen W Smoot
(74) *Attorney, Agent, or Firm*—McDermott Will & Emery LLP

(57) ABSTRACT

According to one embodiment of the present invention, a method of manufacturing a semiconductor device includes below steps.

A step of preparing a phase shift mask and a normal photomask.

A step of stacking a first wiring layer on a semiconductor substrate, and further stacking, on the first wiring layer, a second wiring layer. The a second wiring layer includes a second wiring and a third wiring.

A step of stacking an interlayer insulating film on the second wiring layer.

A step of forming, in the interlayer insulating film, a first opening in which the second wiring is exposed, and a second opening in which the third wiring is exposed by photolithography using the normal photomask.

A step of burying a metal in the first opening and the second opening.

A step of providing a pad to be overlaid on the first and second openings.

14 Claims, 32 Drawing Sheets

FOREIGN PATENT DOCUMENTS

| | | |
|---|---|---|
| JP | 2003-114516 | 4/2003 |
| JP | 2004-134450 | 4/2004 |
| JP | 2004-158833 | 6/2004 |
| JP | 2005-25230 | 1/2005 |
| JP | 2005-116562 | 4/2005 |
| JP | 2005-183407 | 7/2005 |
| JP | 2006-5202 | 1/2006 |
| JP | 2006-165419 | 6/2006 |
| JP | 2006-339406 | 12/2006 |
| WO | WO 2005/083767 | 9/2005 |

* cited by examiner

METHOD OF MANUFACTURING SEMICONDUCTOR DEVICE THAT USES BOTH A NORMAL PHOTOMASK AND A PHASE SHIFT MASK FOR DEFINING INTERCONNECT PATTERNS

BACKGROUND OF THE INVENTION

1. Field of the Invention

The present invention relates to a semiconductor device and a method of manufacturing the semiconductor device.

2. Background Art

A semiconductor device including a reinforcing wiring in a layer under a pad is known as disclosed in, for example, Pamphlet of International Publication No. WO 2005/083767. The pad is the part which a probe contacts at the time of inspection, and is the part where an external connection wiring is formed by bonding and a bump. At the time of probing or forming an external connection wiring, a mechanical force is applied to the pad. When an impact applied to the pad is strong, an unfavorable influence may be exerted on reliability of the pad. Thus, in the above described semiconductor device, the strength of the pad and the structure in the vicinity of the pad are enhanced by providing a reinforcing wiring in the layer under the pad.

Incidentally, as miniaturization of semiconductor devices advances, miniaturization of the structure in the vicinity of the pads is desired. On the other hand, as described above, the demand for securement of strength and reliability of pads is still high. Like this, two functions that are the function of high strength and the function of miniaturization are required of the structure in the vicinity of the pads.

SUMMARY OF THE INVENTION

The present invention is made to solve the problems as described above, and has an object to provide a semiconductor device and a method of manufacturing the semiconductor device, in which a structure in the vicinity of a pad is miniaturized while the pad is reinforced.

According to one aspect of the present invention, a method of manufacturing a semiconductor device includes below steps.

A step of preparing a phase shift mask and a normal photomask. The phase shift mask includes a predetermined light transmission pattern. The normal photomask includes a predetermined light transmission pattern.

A step of stacking a first wiring layer on a semiconductor substrate, and further stacking, on the first wiring layer, a second wiring layer. The second wiring layer is constituted by including a second wiring and a third wiring. The second wiring is connected to a wiring of the first wiring layer. The third wiring is not connected to the wiring of the first wiring layer.

A step of stacking an interlayer insulating film on the second wiring layer.

A step of forming, in the interlayer insulating film, a first opening in which the second wiring is exposed, and a second opening in which the third wiring is exposed. The first opening and the second opening are formed by photolithography using the normal photomask.

A step of burying a metal in the first opening and the second opening.

A step of providing a pad to be overlaid on the first and second openings in which the metal is buried.

In the step of stacking the first and second wiring layers, at least some of wirings of the first and second wiring layers are formed by photolithography using the phase shift mask.

Other and further objects, features and advantages of the invention will appear more fully from the following description.

DETAILED DESCRIPTION OF THE PREFERRED EMBODIMENTS

First Embodiment

Figure 1:
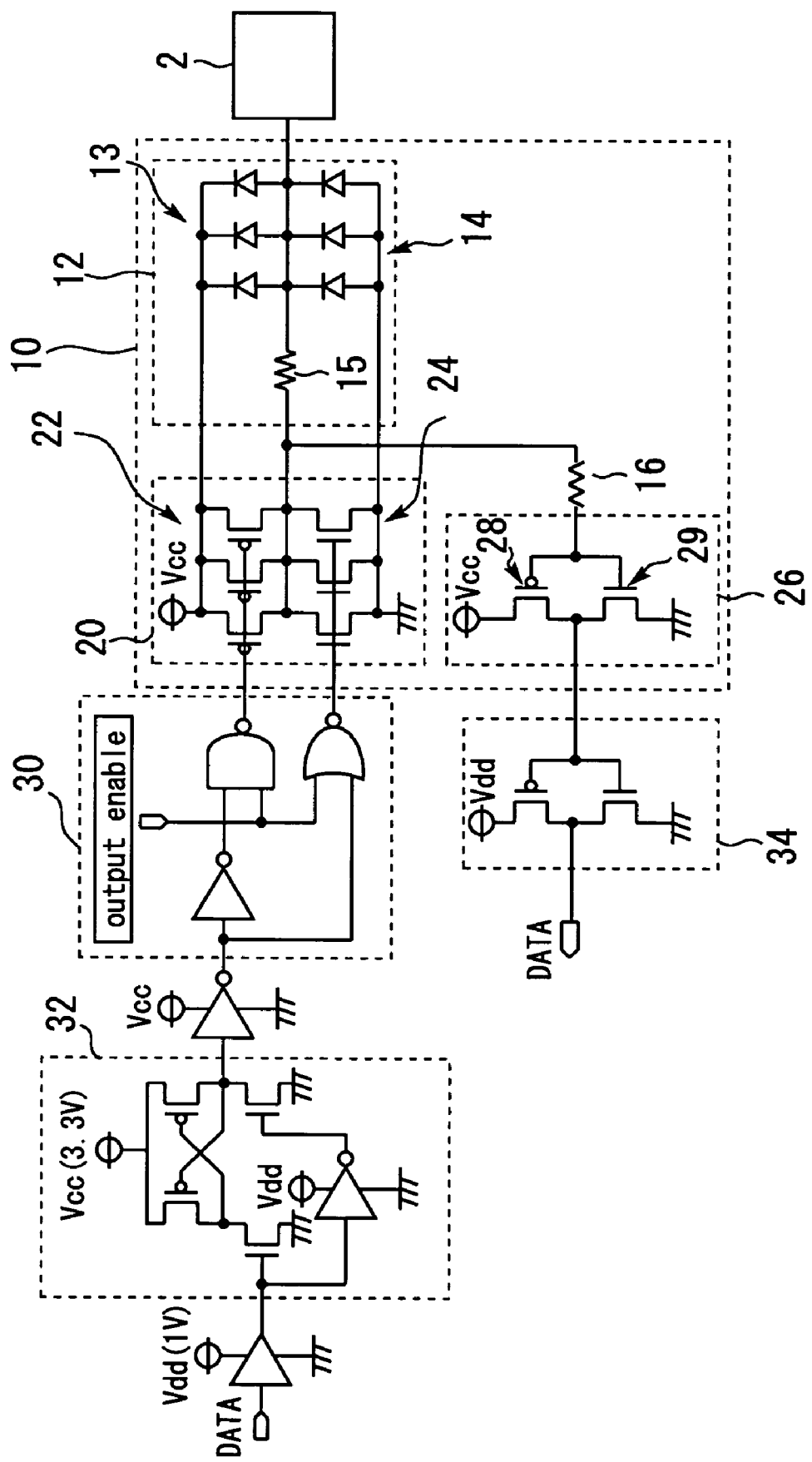
FIG. 1 is a diagram for explaining circuits of the semiconductor device of a first embodiment.

Hereinafter, the constitution of a semiconductor device according to a first embodiment of the present invention will be described by using FIGS. 1 to 4. FIG. 1 is a diagram for explaining circuits of the semiconductor device of the first embodiment. First, internal circuits will be described by using FIG. 1, and thereafter, a concrete structure will be described by using FIGS. 2 to 4.

As shown in FIG. 1, the circuits of the semiconductor device of this embodiment include a pad 2, and an input/output circuit 10 connected to the pad 2. The input/output circuit 10 includes therein a protection circuit 12, an output buffer 20 and an input buffer 26.

The protection circuit 12 is for protecting the semiconductor device from electric static discharge (ESD) applied to the pad 2. The protection circuit 12 is constituted of a rush resistance 15 (protection resistance) interposed between the pad 2 for inputting and outputting a signal, and the output buffer 20 and the input buffer 26, a cramp diode 13 (protection element) connected between the pad 2 and an input/output power source Vccq, and a cramp diode 14 (protection element) connected between the pad 2 and an input/output ground Vssq.

The output buffer 20 is connected to a tri-state logic circuit 30. The output buffer 20 is for outputting a signal from the tri-state logic circuit 30 side to the pad 2. The output buffer 20 is, for example, an inverter circuit constituted of a PMOS transistor 22 and an NMOS transistor 24. The input buffer 26 is, for example, an inverter circuit constituted of a PMOS transistor 28 and an NMOS transistor 29. An output level shift circuit 32 is connected to the tri-state logic circuit 30. An input level shift circuit 34 is connected to the input/output circuit 10 via the input buffer 26.

When noise at a voltage higher than a power source Vcc or at a voltage lower than a ground is applied to the pad 2 due to ESD, the rush resistance 15 weakens the noise waveform, and the cramp diodes 13 and 14 release the surge current which occurs due to the noise to the power source Vcc or the ground. Ultimately, the surge current released to the power source Vcc and the ground escapes from a pad for supplying a power source (power source pad) to a substrate mounted with the semiconductor device via a bonding wire. Thereby, the output buffer 20 and the input buffer 26 can be prevented from being broken by surge.

Furthermore, a rush resistance 16 having a resistance value larger than that of the rush resistance 15 is formed upstream of the input buffer 26 (between the output buffer 20 and the input buffer 26). Thereby, the gate insulation film of the input buffer 26 is protected from a surge current. In this embodiment, the rush resistance 15 between the pad 2 and the output buffer 20 has a resistance value from, for example, 5Ω to 30Ω inclusive, and has a resistance value of 10Ω in concrete. The rush resistance 16 upstream from the input buffer 26 has a resistance value of 200Ω or more for protecting the gate insulating film from ESD surge, and has a resistance value of, for example, 300Ω. In order not to impair the drive ability of the output buffer 20, the rush resistance 15 between the output buffer 20 and the pad 2 is preferably made small as compared with the rush resistance 16 upstream from the input buffer 26.

In FIG. 1, only one input/output pad 2 is shown for simplifying the explanation, but the actual semiconductor device includes a plurality of input/output pads 2. The output buffer 20, the protection circuit 12 and the input buffer 26 are respectively provided at each of the input/output pads 2.

Figure 2:
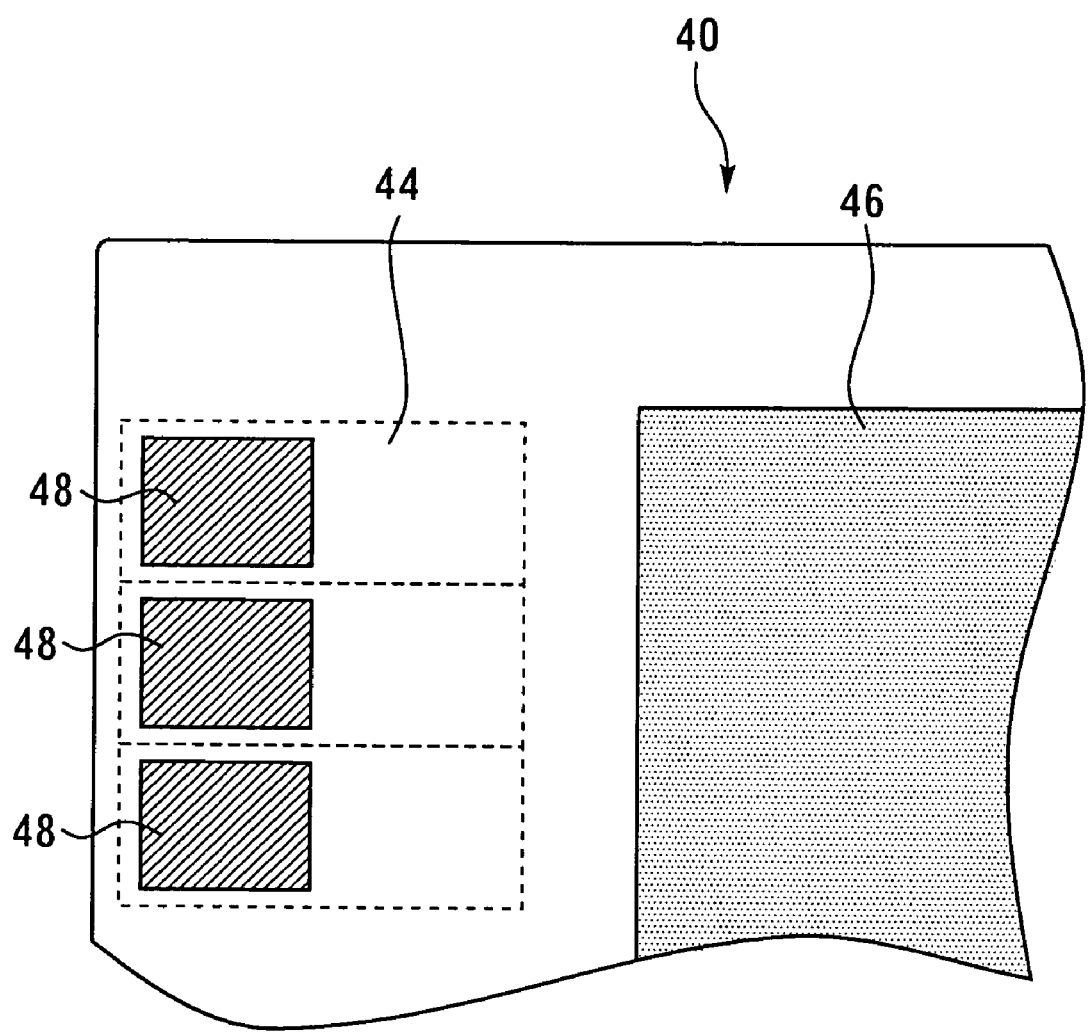
FIG. 2 is a schematic view explaining the surface structure of a semiconductor device according to the first embodiment.

FIG. 2 is a schematic view explaining the surface structure of a semiconductor device 40 according to the first embodiment. The semiconductor device 40 includes therein the circuits shown in FIG. 1. As shown in FIG. 2, the semiconductor device 40 includes a plurality of I/O cell regions 44 on its surface. Each of the I/O cell regions includes a pad 48. The length in the longitudinal direction of the I/O cell region 44 in FIG. 2 is about 110 to 130 μm in this embodiment.

A core circuit 46 is included at a center side of the semiconductor device 40. The structure of the core circuit region 46 (wiring, an active element, etc.) is not actually exposed to the surface (the uppermost layer), but housed inside the semiconductor device 40. Though omitted in FIG. 2, a plurality of pads 48 are actually provided to be located along the end portion of the semiconductor device 40.

The pad 48 in FIG. 2 corresponds to the pad 2 in the circuits of FIG. 1. In the lower layer (layer on the back side of the paper of FIG. 2) of the region shown as the I/O cell region 44, the structure corresponding to the input/output circuit 10 in the circuit in FIG. 1 is provided. In the core circuit 46, for example, the tri-state logic circuit 30 and the like out of the internal circuits in FIG. 1 are properly formed.

Figure 3:
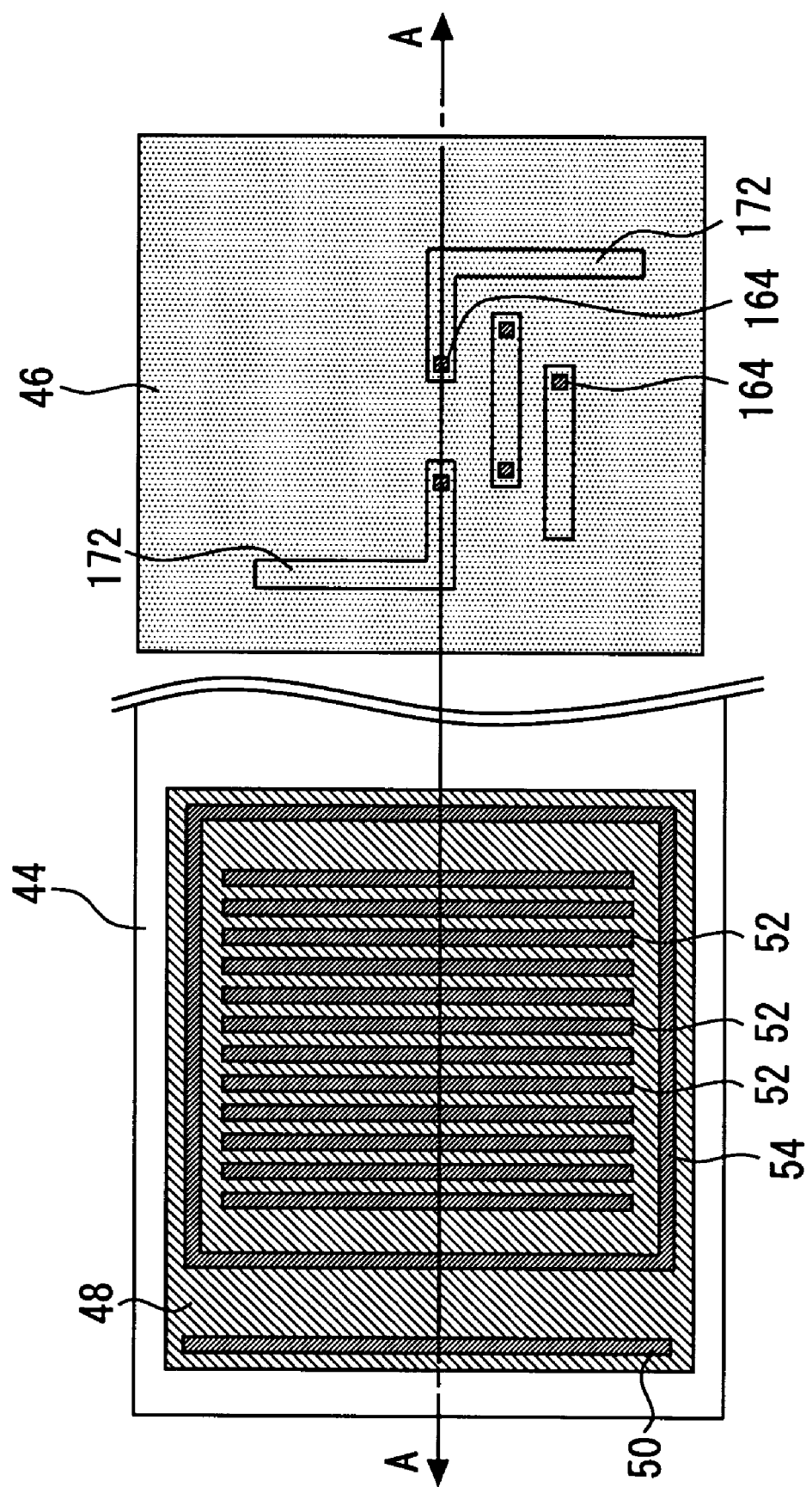
FIG. 3 is a view showing the I/O cell region and the core circuit region shown in FIG. 2 by partially enlarging them.

FIG. 3 is a view showing the I/O cell region 44 and the core circuit region 46 shown in FIG. 2 by partially enlarging them and moving them close to each other. FIG. 3 also shows the structure of a layer lower by one layer from the surface through the surface of the semiconductor device 40.

The pad 48 is located on the I/O cell region 44. In the layer under the pad 48, a wiring 50, a plurality of reinforcing wirings 52, and a reinforcing annular wiring 54 which is provided to enclose the reinforcing wirings 52 are provided. The wiring 50 and the reinforcing wirings 52 are each formed in a slit shape (linear shape) as shown in the drawing. These wirings are each formed with a predetermined width, and are connected to the pad 48 on the back surface of the pad 48. In the core circuit region 46, a wiring 172 and a plug wiring 164 which will be described later are provided. The wiring 172 is connected to the plug wiring 164, and is electrically conducted to the wiring in the further lower layer via the plug wiring 164.

Figure 4:
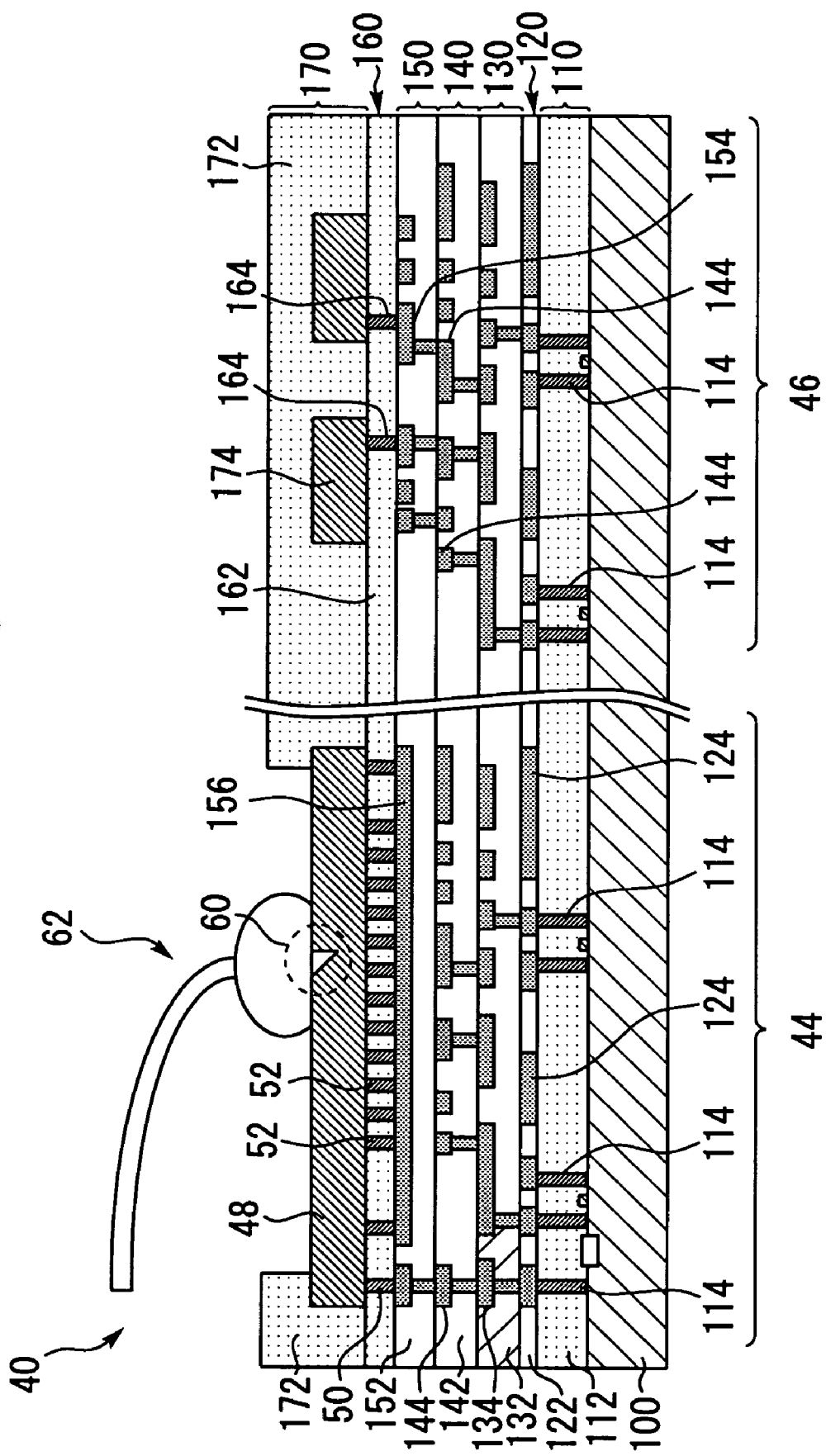
FIG. 4 is a sectional view taken along line A-A in the semiconductor device of the first embodiment.

FIG. 4 is a sectional view taken along line A-A in FIG. 3 in the semiconductor device 40 of the first embodiment. In FIG. 4, the I/O cell region 44 and the core circuit region 46 are also partially enlarged and are shown with the distance between them omitted as in FIG. 3. The semiconductor device 40 is formed by stacking a multilayer wiring structure on a semiconductor substrate 100. Hereinafter, each layer will be described in sequence of a first wiring layer 110.

The first wiring layer 110 is a layer constituted by forming plug wirings 114 in an interlayer insulating film 112. The interlayer insulating film 112 is formed from $SiO_2$. The plug wiring 114 is formed from tungsten (W). A second wiring layer 120 is stacked on the first wiring layer 110. The second wiring layer 120 is a layer constituted by forming wirings 124 in an interlayer insulating film 122. The interlayer insulating film 122 is an insulating film formed from a low dielectric constant material (hereinafter, also called "a Low-k material" and "Low-k"), and is formed from SiOC in concrete. The wiring 124 is formed by using copper (Cu).

A third wiring layer 130, a fourth wiring layer 140 and a fifth wiring layer 150 are further stacked on the second wiring layer 120. These layers are the layers constituted by forming wirings 134, 144 and 154 by using Cu in interlayer insulating films 132, 142 and 152 formed from SiOC. The wirings 134, 144 and 154 include plug wiring portions at their lower portions, and are connected to the wirings in the lower layers via the plug wiring portions. In the I/O cell region 44 of the fifth wiring layer 150, a wiring 156 as a floating wiring which does not connect to the lower layer wirings (wirings of the first to the fourth wiring layers) is formed. The wiring 156 contributes to reinforcement of the pad together with the reinforcing wirings further provided on the upper layer.

A sixth wiring layer 160 is further stacked on the fifth wiring layer 150. The sixth wiring layer is a layer constituted by forming the aforementioned wiring 50, reinforcing wirings 52, reinforcing annular wiring 54 and plug wirings 164 on an interlayer insulating film 162. The interlayer insulating film 162 is formed by using $SiO_2$. The wiring 50, the reinforcing wirings 52, the reinforcing annular wiring 54 and the plug wirings 164 are formed from tungsten (W).

An uppermost layer 170 is stacked on the sixth wiring layer 160. The uppermost layer 170 is constituted by including the pad 48, an insulating layer 172 and a wiring 174. The insulating layer 172 is provided with a passivation film not illustrated. The pad 48 is formed by using aluminum (Al). The pad 48 is provided to be overlaid on the wiring 50, the reinforcing wirings 52 and the reinforcing annular wiring 54 of the sixth wiring layer so as to be in contact with them. The wiring 174 is formed to be overlaid on the plug wiring 164, and is connected to the wiring in the lower layer via the plug wiring 164.

The semiconductor device 40 is manufactured by a manufacturing method of the first embodiment which will be described later. In the manufacturing process of the semiconductor device, probing is performed into the pad for the purpose of inspection. FIG. 4 shows a probe mark 60 formed by such a probing step. As will be described later, in the manufacturing method of this embodiment, probing is performed into the part of the pad 48, which is reinforced by the reinforcing wirings 52. Therefore, according to the manufacturing method of this embodiment, the probe mark 60 remains above the reinforcing wirings 52 as shown in the drawing. As shown in FIG. 4, in the semiconductor device 40, a wire 62 as an external connection wiring is bonded to the position corresponding to the probe mark 60.

As shown in FIG. 4, in the semiconductor device 40 of the first embodiment, the wirings 124, 134 and 144 are located in the portions below the pad 48, which are the first to the fourth wiring layers. The structure in which the wirings are provided below the pad is the structure which is also called a pad on active area structure (Pad on Active Area: PAA structure). According to the PAA structure, the space at the side of the layer under the pad is used as a wiring space, and high integration and miniaturization of the semiconductor device can be achieved. In the semiconductor device 40, the pad 48 is connected to the semiconductor substrate 100 via the wiring 50 and the wirings of the further lower layers, which are connected to the wiring 50. By providing contact from the pad to the substrate like this, the effect as the countermeasures against surge is obtained.

The characteristics, effect and the like of this embodiment will be described in concrete hereinafter. In the following description, "the related art of forming the structure under a pad" will be described first, and subsequently, "the characteristic technique of this embodiment" and "the concrete manufacturing method based on the idea of this embodiment" will be described in sequence.

Various arts relating to the reinforcing wiring layer under a pad including Pamphlet of International Publication No. WO 2005/083767 are disclosed. For example, Japanese Patent Laid-Open No. 2006-165419, Japanese Patent Laid-Open No. 2004-134450, and Japanese Patent Laid-Open No. 2006-5202 disclose the ideas of providing ring-shaped/annular (in these Patent Documents, the wirings in a rectangular shape are also called a ring-shaped wiring and the like) reinforcing wirings and the like other than slit-shaped reinforcing wirings. In the semiconductor device 40, the strength of the pads is enhanced by providing the reinforcing wirings in the layer under the pad as in these ideas.

On formation of these reinforcing wirings, use of photolithography is assumed similarly to the other wirings. With regard to the photolithography technique, various techniques are disclosed in, for example, Japanese Patent Laid-Open No. Hei 10-73914, Japanese Patent Laid-Open No. 2003-114514, Japanese Patent Laid-Open No. Hei 9-179287, and Japanese Patent Laid-Open No. 2005-25230 and the like.

Photomasks used at the time of photolithography include normal photomasks (hereinafter, also called "normal photomasks"), and phase shift masks. A normal photomask is a photomask with which a light-shielding pattern is formed on a transparent substrate, and light transmission or light shielding can be selectively performed. A phase shift mask is a photomask capable of obtaining a high resolution by changing the phase of a part of light as the halftone masks which are also disclosed in the above described prior art documents. In the related arts, normal photomasks are used when the wiring widths and wiring pitches are rough (large), and phase shift masks are used when they are smaller (finer).

As already described, various reinforcing wirings under pads are disclosed. As in these documents, for example, linear patterns are said to be preferable for the patterns of the reinforcing wiring provided under a pad. It is also said that by providing a reinforcing wiring in a ring form under a pad, the effect of preventing the propagation of a crack in the layer under the pad is obtained. These patterns tend to be formed with relatively rough pitches and large widths. Therefore, there is a strong tendency to manufacture them by using normal photomasks.

Further, if, for example, a halftone mask is used when forming the above described linear or annular wiring, the problem which will be described next may occur. When a reinforcing pattern is formed on the pad region, if, for example, a linear (slit-shaped) pattern is formed, the opening ratio (open region/total region) of the mask in the pad region becomes extremely large as compared with the opening ratio of the mask in the core circuit region. For example, the opening ratio of the region provided with the slit-shaped pattern is 50% or more. On the other hand, the opening ratio of the core circuit region is 30% or less even when via-holes are aligned at the minimum pitches.

From the open portion of a resist, diffraction light diagonally incident on the light shielding region occurs. When the opening ratio is high, the intensity of the diffraction light becomes high. The intensity of light for exposure is set at such an intensity that sufficient exposure is secured in the core circuit region with a low opening ratio. Therefore, even the light intensity is set at preferable value to the core circuit region having a low opening ratio, the light intensity may become excessive in the slit pattern forming region (pad region) having a high opening ratio.

Use of a halftone mask can create a portion where the phase of the transmitted light from the halftone region corresponds to the phase of the diffraction light, on the resist. As a result that the phases of the diffraction light and the transmitted light of the halftone region correspond to each other, light with such an intensity as to develop the resist may occur. This phenomenon is called "exposure of a resist by occurrence of a sub peak in a light shielding region". If such a sub peak occurs, an unneeded pattern is formed in an unintended region in design. Since such an event is feared, a normal photomask is preferably used for formation of the reinforcing patterns.

As high integration and the like of a semiconductor device advance, the wiring pitches, wiring widths and the like tend to be reduced. Therefore, small (fine) patterns tend to be formed for the wirings of the core circuit region and the lower layer wirings on the side of the pad region (I/O region).

Figure 5:
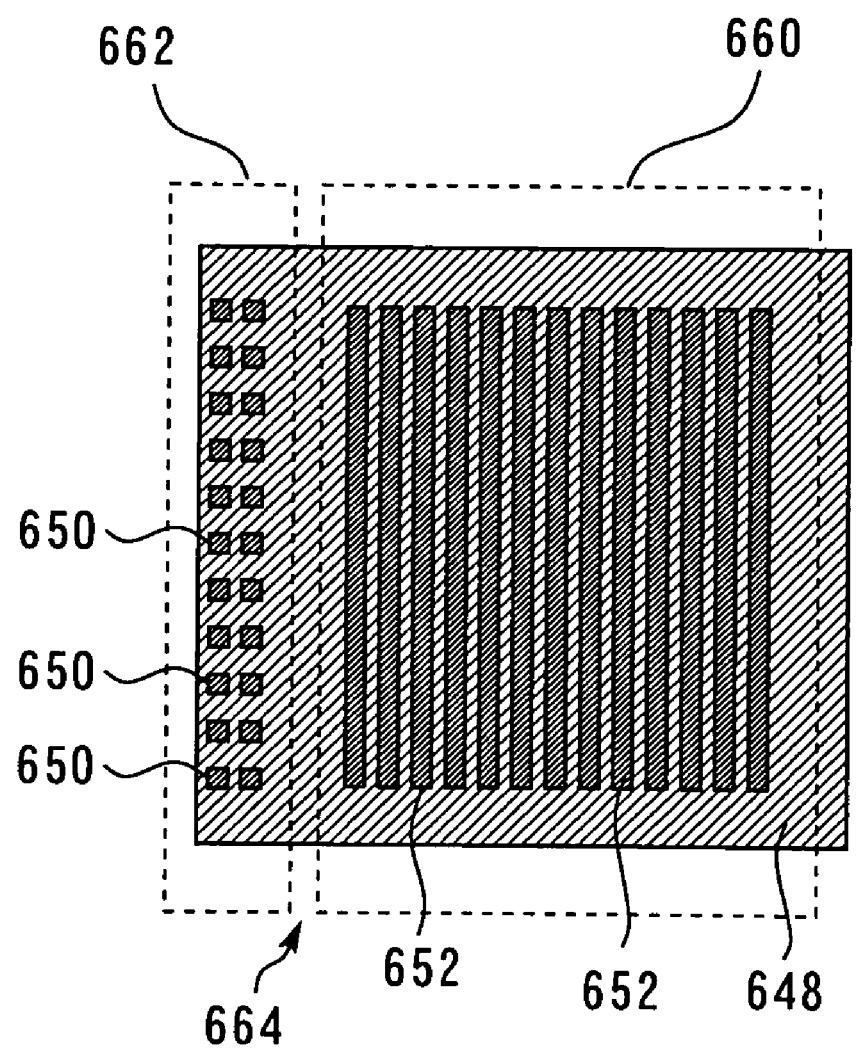
FIG. 5 is a view for explaining an example of a wiring pattern by using a normal photomask and a halftone mask.

FIG. 5 is a view for explaining the manufacturing method of a pad and a wiring structure of the layer under the pad. In the example in FIG. 5 (hereinafter, also called "comparative example"), a plurality of linear reinforcing wirings 652, and a plurality of plug wirings 650 for contact with the lower layer are provided in the layer under a pad 648. These wirings are all connected to the back surface of the pad 648.

In this comparative example, the wirings in the layer under the pad 648 are produced by using both a normal photomask and a halftone mask as shown by the broken line in FIG. 5. In concrete, the reinforcing wirings 652 are produced by using the normal photomask, and the plug wirings 650 are produced by using the halftone mask.

However, the inventor of the present application conceives the problem of the above described structure in FIG. 5 from the viewpoint which will be described as follows. As miniaturization of the semiconductor device advances, miniaturization of the structure in the vicinity of the pad is desired. Specifically, two functions which are the above described function of high strength and the function of being capable of achieving miniaturization are required of the structure in the vicinity of the pad.

In the structure in FIG. 5, two kinds of masks are used. When the two kinds of masks (that is, the structure of a normal photomask and the structure of a halftone mask) are provided on one transparent substrate, it is difficult to bring these two kinds of mask structures into close contact with each other completely due to precision of a mask writer. Specifically, it is said to be preferable to secure a certain degree of margin between the two kinds of mask structures (such a margin is also called "a mask overlapping margin"). In FIG. 5, as shown by the broken line, a little distance (mask overlapping margin 664) is provided between a normal photomask region 660 and a halftone mask region 662.

Under the situation where such a mask overlapping margin has to be made, miniaturization of the pad structure may be inhibited on the contrary. Specifically, though further miniaturization is possible, the size of the pad may become the size including the mask overlapping margin. The size of the pad influences the wiring structure (for example, running of the wiring of an I/O circuit) of the lower layer side from the pad. Therefore, if miniaturization of the size of the pad is inhibited, the circuit in the layer under the pad also tediously extends correspondingly, and miniaturization of the semiconductor device becomes difficult as a result.

In other words, the event in which even if the circuit space in the layer under the pad is still capable of being reduced, miniaturization cannot be sufficiently achieved by the influence of the pad size. More specifically, for example, when a distance of about 5 to 10 μm is secured as a mask overlapping margin, the size of the pad also increases by about 5 to 10 μm naturally. As a result, the event in which the circuit in the layer under the pad is influenced by the mask overlapping margin, and the circuit wiring region cannot be sufficiently reduced can occur.

Thus, in this embodiment, the above described problem is overcome by the following technique. In this embodiment, lower layer wirings are firstly formed on the semiconductor substrate for both the I/O cell region and the core circuit region by photolithography using a halftone mask. Subsequently, in the layer corresponding to the layer under the pad (the sixth wiring layer in this embodiment), a pattern is formed for the wiring of the portion under the pad in the I/O cell region by photolithography using a normal photomask. Specifically, the wiring 50 connecting the pad and the lower layer wiring, the reinforcing wirings 52 and the reinforcing annular wiring 54 provided for reinforcement of the pad, in the layer under the pad are formed by a normal mask.

By using only the normal photomask without using two kinds of photomasks as above, the wiring of the layer under the pad can be formed without providing a mask overlapping margin. As a result, inhibition of miniaturization of the structure in the vicinity of the pad due to the mask overlapping margin can be avoided.

As described above, the shape of the reinforcing wirings under the pad is preferably a slit shape. By providing the annular reinforcing wiring which encloses the slit-shaped reinforcing wirings, reinforcement can be performed more effectively. By using a normal photomask at the time of forming these patters, a harmful effect due to occurrence of a sub peak already described can be prevented. Specifically, by using the normal photomask including a light shielding film in the reinforcing pattern region with a high opening ratio, exposure of a resist due to occurrence of a sub peak in the light shielding region can be suppressed to the extent without a problem.

As described above, according to the technique according to this embodiment, the two functions of achieving high strength and miniaturization required of the structure in the vicinity of the pad can be made compatible at a high level. Further, in the respect of being capable of achieving the above described two functions while solving various problems such as a harmful effect due to occurrence of sub peak, this embodiment can be said to be an extremely excellent technique.

Hereinafter, by using FIGS. 6 to 24, a method of manufacturing the semiconductor device according to this embodiment will be described. This manufacturing method is one example of the manufacturing method carried out based on the idea of the embodiment described above. In the following description, "(i) a manufacturing method of a mask used in this manufacturing method" will be described first, and "(ii) the method of manufacturing the semiconductor device according to this embodiment" carried out by using the mask will be described next.

(i) Manufacturing Method of the Mask Used in this Manufacturing Method

Figure 6A:
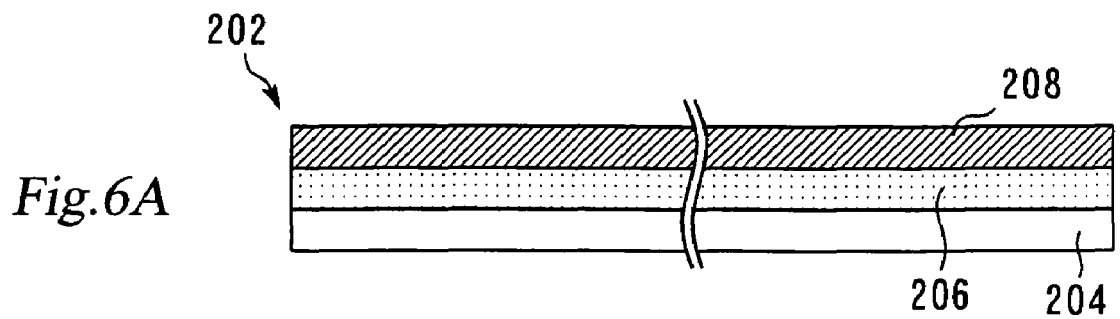
FIG. 6 show a manufacturing method of a photomask according to the first embodiment.

Hereinafter, one example of a manufacturing method of a mask 202 used in the method of manufacturing the semiconductor device according to this embodiment will be described by using FIGS. 6A to 6E and 7. The mask 202 is a mask in which a normal photomask and a halftone mask are formed in one transparent substrate. FIGS. 6A to 6E are views showing sectional views of the mask 202 by simplifying them in accordance with the progress of the manufacturing method. On producing the mask 202, a member formed by stacking a phase shift layer 206 and a light shielding layer 208 on a glass substrate (quartz) 204 is prepared (FIG. 6A). The material of the phase shift layer 206 is properly selectable, and various known materials can be used.

Figure 6B:
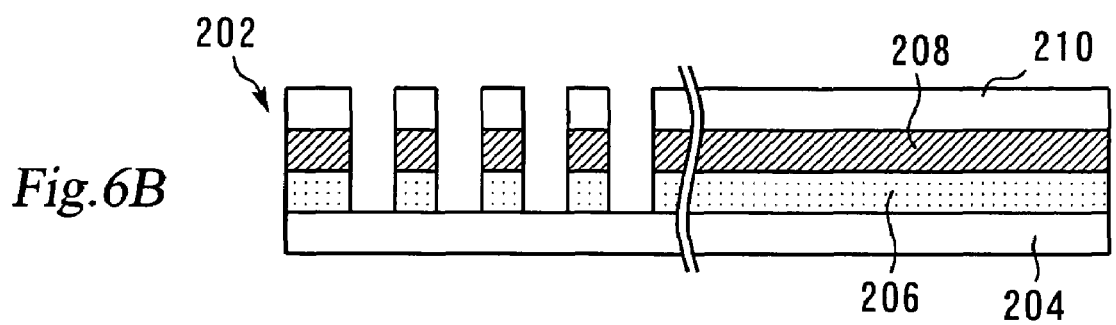

Next, a resist 210 is provided in a region where a normal photomask is formed, of the above described prepared member. Thereafter, the resist is developed by, for example, EB exposure (Electron beam exposure), and is etched (FIG. 6B). The pattern etched in FIG. 6B corresponds to a light transmission pattern of the wiring of the layer under the pad (including both the wiring for connecting the lower layer wiring, and the reinforcing wiring) in the manufacturing method according to this embodiment.

Figure 6C:
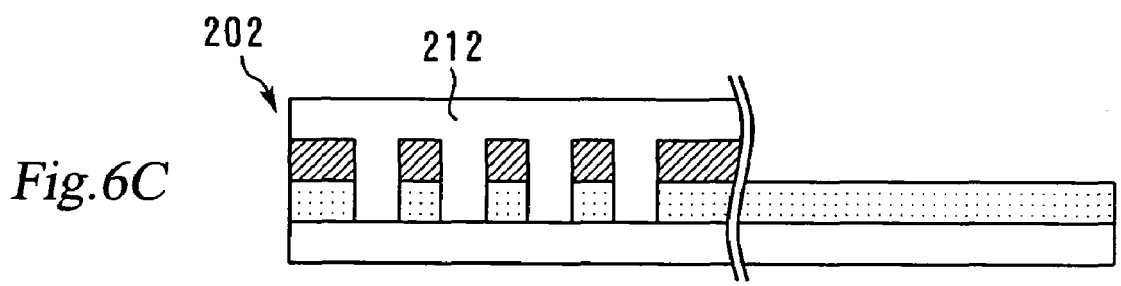
Figure 6D:
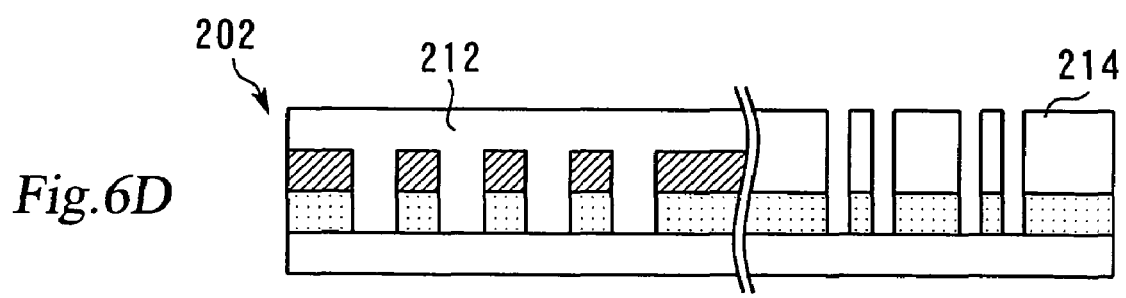
Figure 6E:
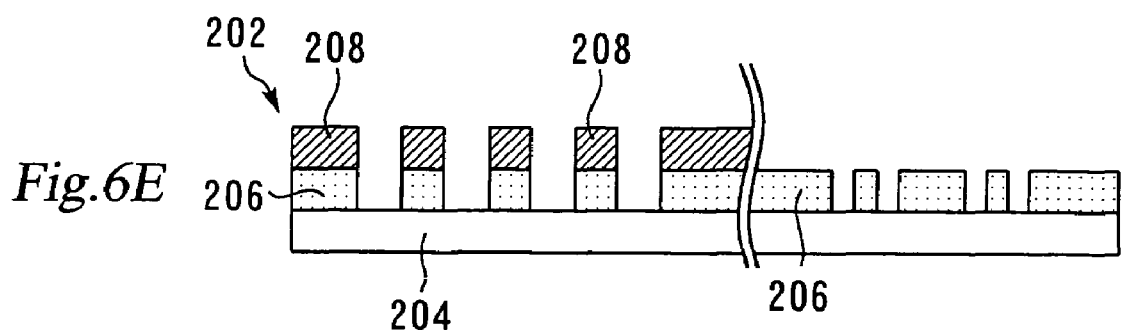

Subsequently, a halftone mask region is formed (FIG. 6C). As shown in FIG. 6C, only a normal photomask region is coated with a resist 212, and the light shielding layer 208 of the halftone mask region is removed by etching. Subsequently, the halftone mask region is coated with a resist 214, and exposure and etching are performed. Thereby, a light transmission pattern for a via (pattern for a plug wiring) is formed in a phase shift layer 206 (FIG. 6D). Thereafter, the resist is removed, and the mask 202 is completed (FIG. 6E).

Figure 7:
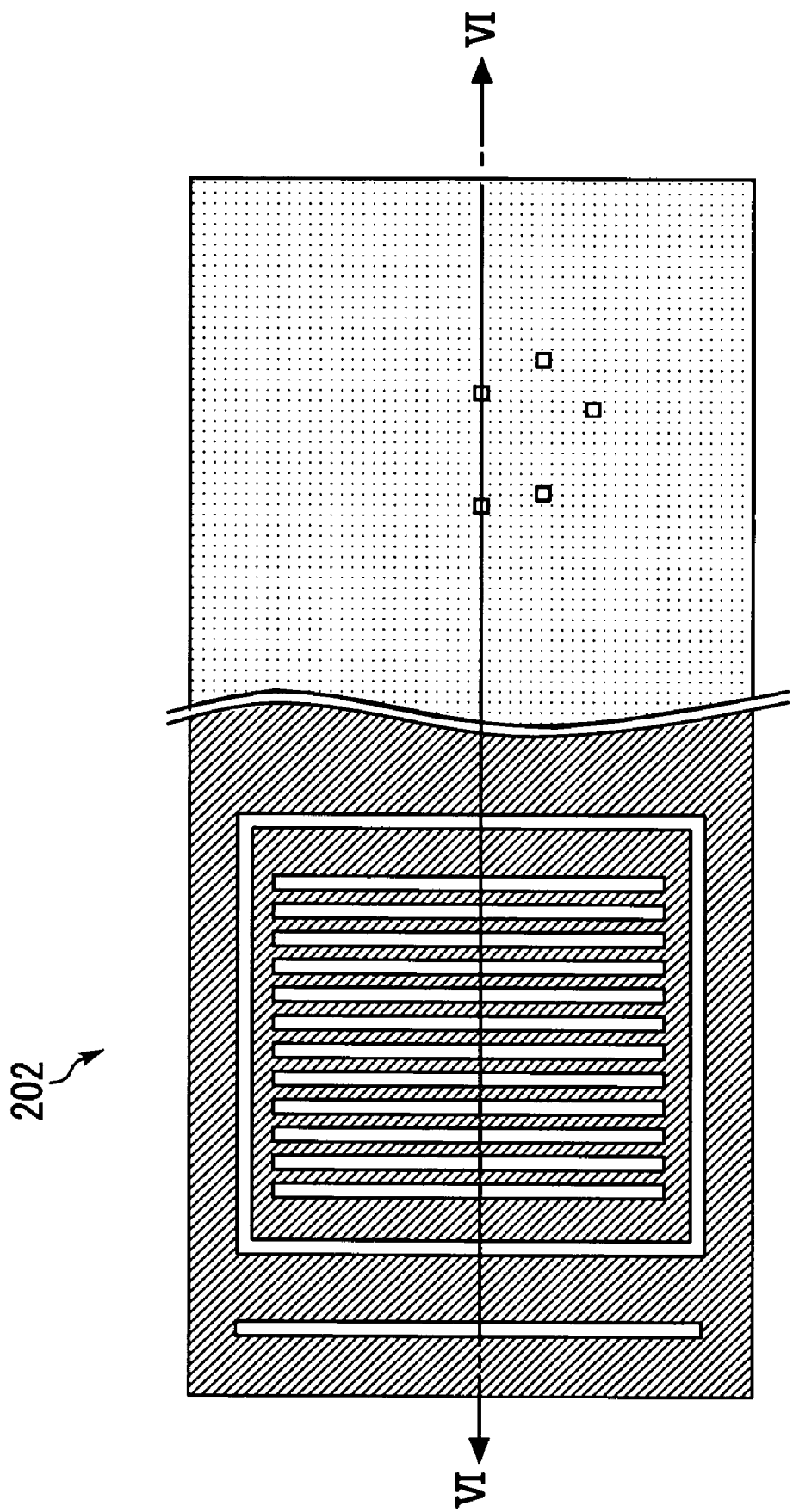
FIG. 7 is a plan view of the photomask according to the first embodiment.

FIG. 7 is a plan view (view seen from above the paper surface of FIG. 6E) of the mask 202, and is a view showing a pattern of a part of it by enlarging it. As shown in the drawing, the mask 202 includes a plurality of slit-shaped light transmission patterns and an annular light transmission pattern provided to enclose some of the slit-shaped patterns in the normal photomask region. In this embodiment, the width of each of these light transmission patterns is set to be the length not longer than the wavelength of the light source in the photolithography at the time of forming the wirings of the layer under the pad which will be described later. Strictly speaking, the annular pattern in FIG. 7 is rectangular, but when something is described as "annular" in this embodiment, it is not limited to being rectangular, but it includes being polygonal. As the reinforcing wiring 52 of the I/O cell region 44, it is not limited to the slit-shaped pattern, but various patterns are selectable. However, when the pattern occupancy ratio reduces, the effect of reinforcing the structure becomes small. Thus, the reinforcing wiring 52 pattern occupying ratio of the portion where the probe mark 60 is formed in the pad 48 is preferably at least 40% or more, and more preferably 50% or more. The pattern occupancy ratio of the plug wiring 164 of the core circuit region 46 is lower than the pattern occupancy ratio of the reinforcing wiring 52 of the aforementioned probe mark 60 region. The occupancy ratio of the plug wiring 164 in the core circuit region is, for example, 30% or less.

(ii) Method of Manufacturing the Semiconductor Device According to this Embodiment Next, the method of manufacturing the semiconductor device according to this embodiment will be described by using FIGS. 8 to 24. Here, the method of manufacturing the above described semiconductor device 40 will be described. The above described mask 202 is used in the step of forming a wiring layer (the sixth wiring layer 160 in the semiconductor device 40) of the layer under the pad, in the process of this manufacturing method.

Figure 8:
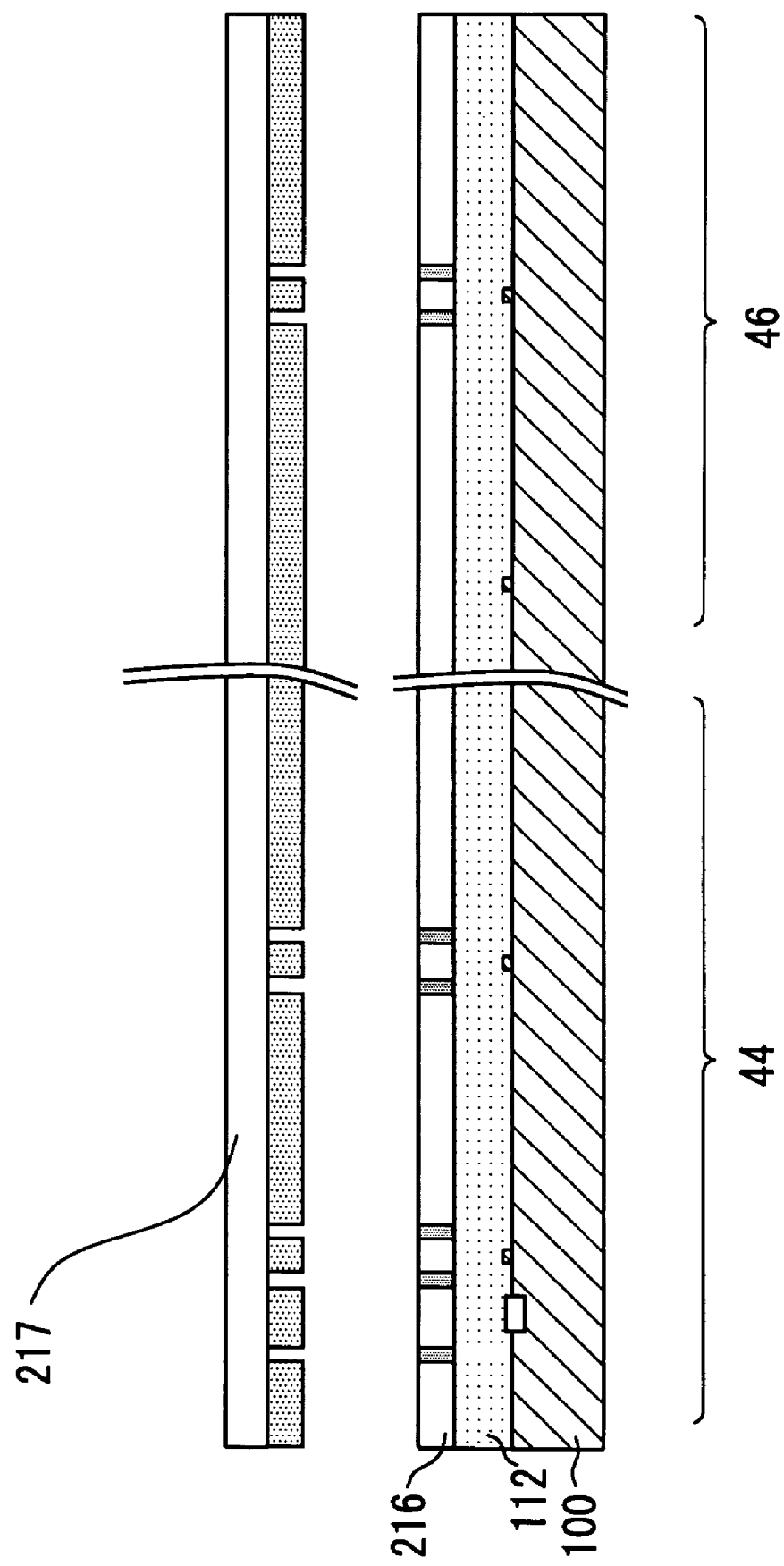
FIG. 8 is a diagram for explaining a method of manufacturing the semiconductor device according to the first embodiment.
Figure 9:
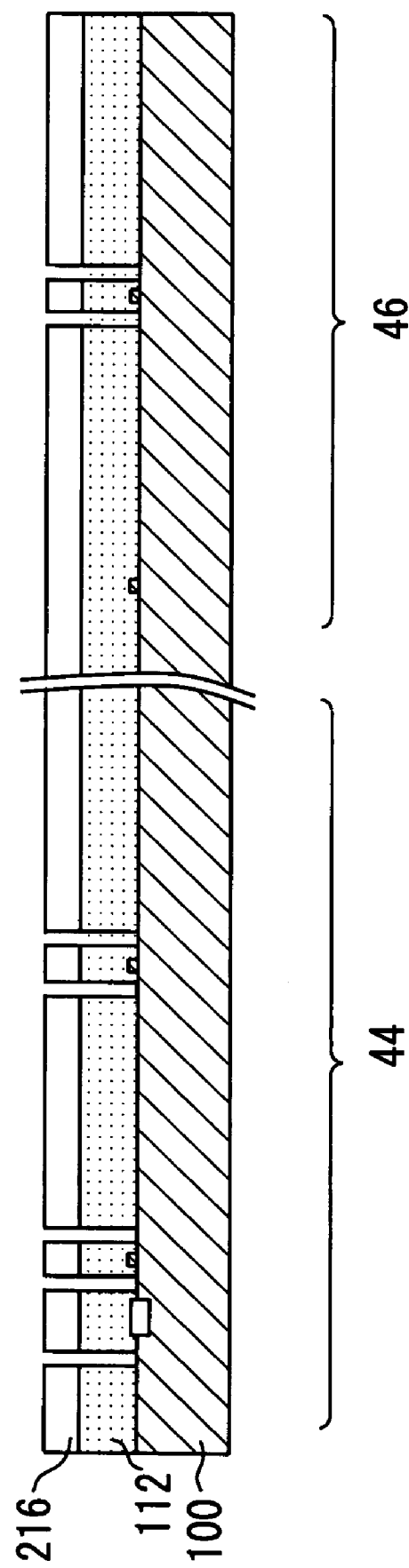
FIG. 9 is a diagram for explaining the method of manufacturing the semiconductor device according to the first embodiment.

In the manufacturing method of this embodiment, the first wiring layer is firstly stacked on the semiconductor substrate 100. FIG. 8 is a sectional view for explaining this step. The interlayer insulating film 112 is stacked on the semiconductor substrate 100 on which a predetermined structure is formed, and a resist 216 is further stacked on the interlayer insulating film 112. A pattern corresponding to the first wiring layer is developed on the resist 216 by using a halftone mask 217 in which a predetermined light transmission pattern is formed, and etching is performed. Thereafter, tungsten is buried in openings formed by etching, and plug wirings 114 are formed (FIG. 9).

Subsequently, the interlayer insulating film 122 is stacked on the first wiring layer 110, and the wirings 124 are formed by using a single damascene method. Thereby, the second wiring layer 120 is formed. Thereafter, the interlayer insulating film 132 (Low-k film) is stacked thereon, and the wirings 134 are formed by a dual damascene method. Thereby, the third wiring layer 130 is formed. Subsequently, the same technique as the third wiring layer 130 is repeated, and the fourth and the fifth wiring layers are formed in sequence. In this manner, the lower layer wirings are formed respectively.

Figure 10:
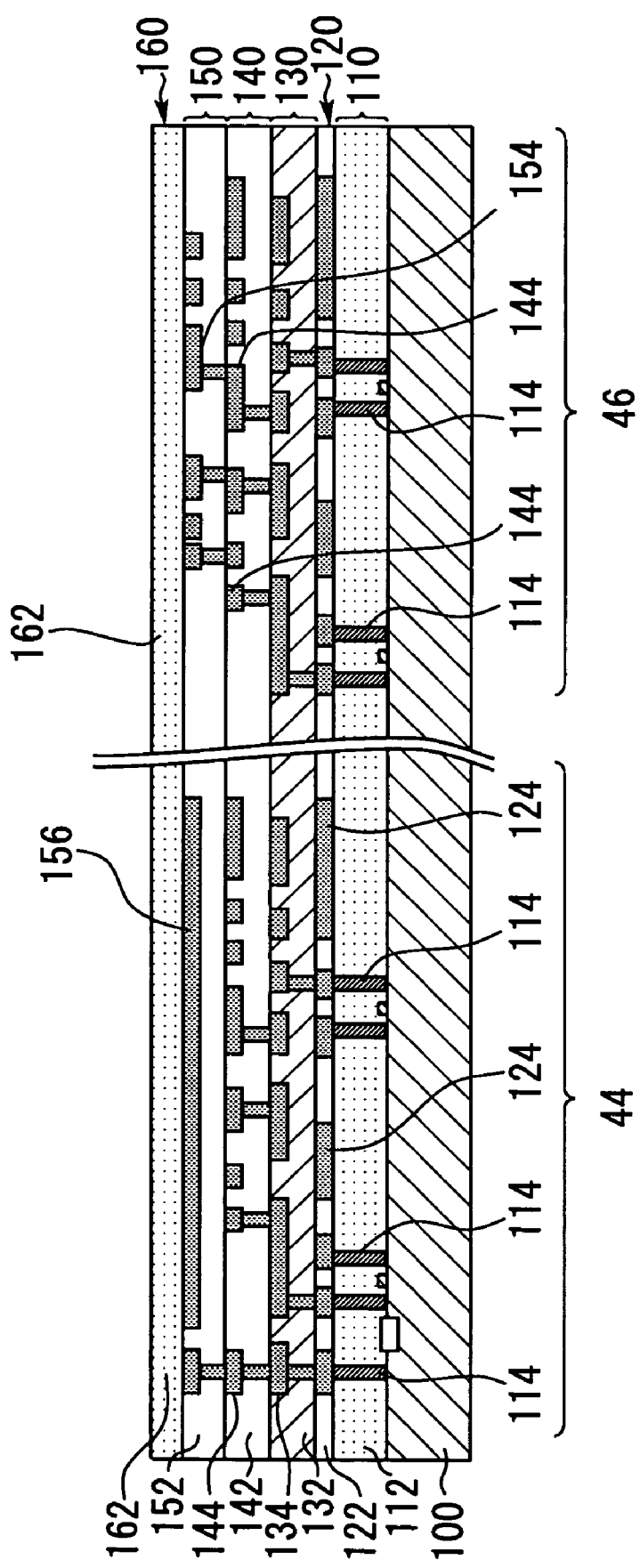
FIG. 10 is a diagram for explaining the method of manufacturing the semiconductor device according to the first embodiment.

In the first to the fifth wiring layers, plug wirings for connecting to the lower wiring layers are properly formed, though they are not especially assigned with reference numerals. In this embodiment, the diameters (bore diameters) of these plug wirings are set to be the lengths not longer than the wavelength of the irradiated light at the time of photolithography. Next, in order to form the sixth wiring layer corresponding to the layer under the pad, an interlayer insulating film 162 is further stacked thereon. FIG. 10 is a sectional view showing the state after the series of steps are carried out.

Figure 11:
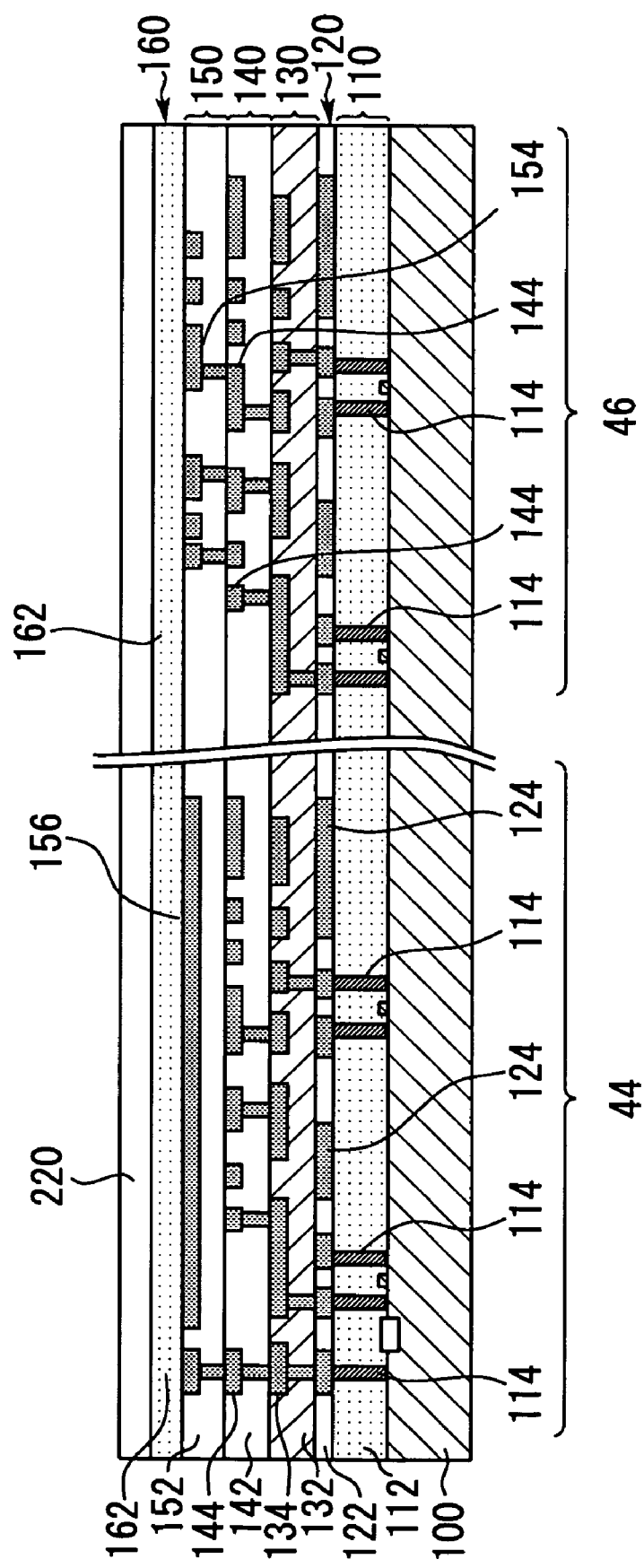
FIG. 11 is a diagram for explaining the method of manufacturing the semiconductor device according to the first embodiment.
Figure 12:
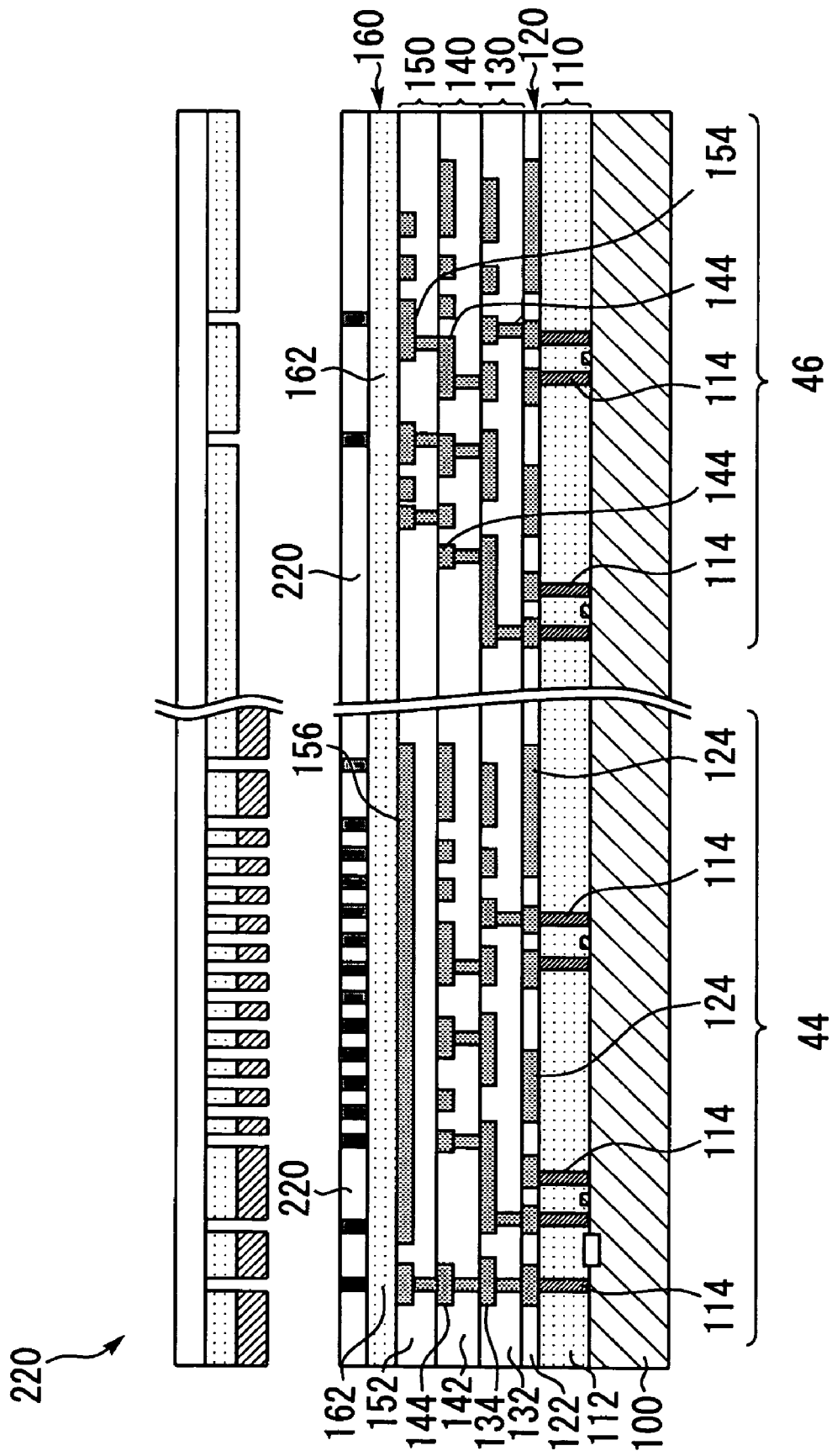
FIG. 12 is a diagram for explaining the method of manufacturing the semiconductor device according to the first embodiment.
Figure 13:
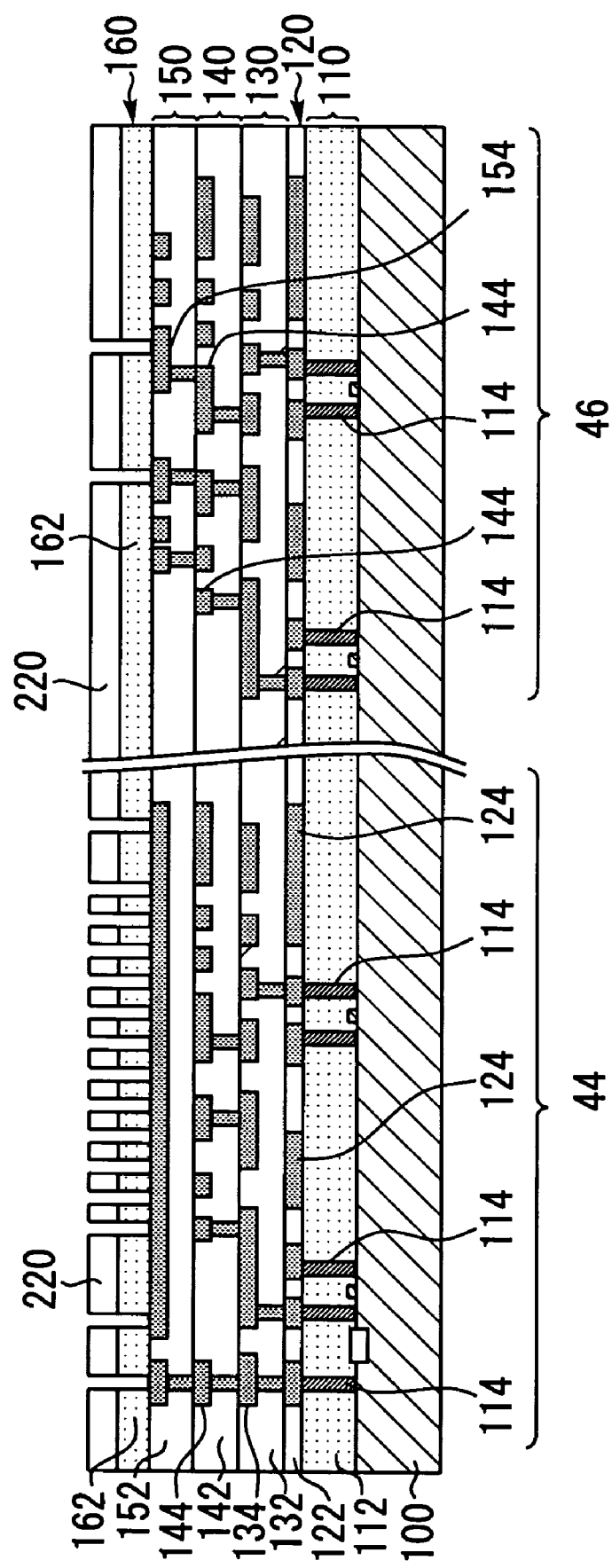
FIG. 13 is a diagram for explaining the method of manufacturing the semiconductor device according to the first embodiment.

Next, a resist 220 is coated on the interlayer insulating film 162 (FIG. 11). Subsequently, by using the mask 202 produced as described above, wiring patterns are respectively developed onto the I/O cell region (pad region) 44 and the core circuit region 46. At this time, the wiring pattern for the pad region 44 is developed by using a normal photomask region of the mask 202, and the wiring pattern for the core circuit region 46 is developed by using a halftone mask region of the mask 202. Thereafter, the openings corresponding to the pattern are formed in the interlayer insulating film 162 by etching (FIG. 13). In the state of FIG. 13, the wiring 154 is exposed from some of the openings, and the wiring 156 is exposed from the other openings.

Figure 14:
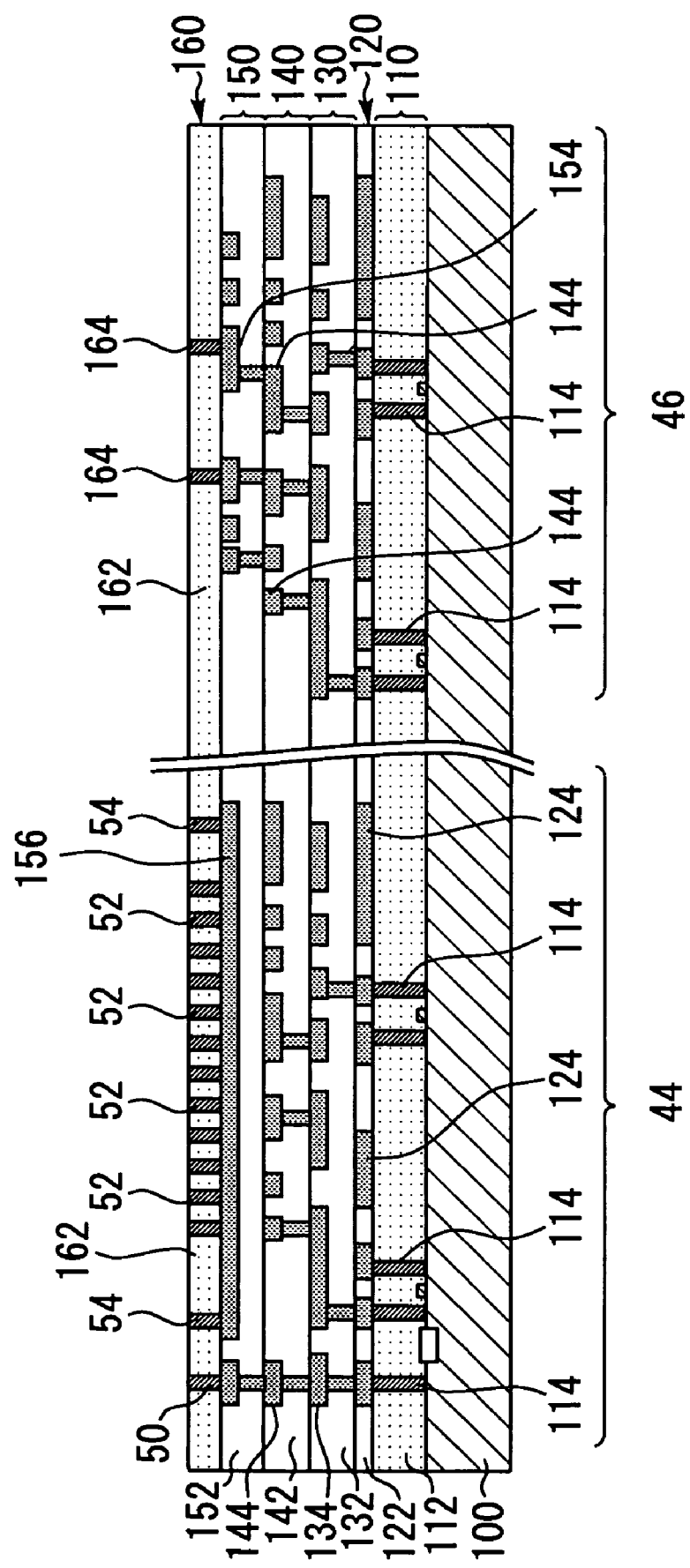
FIG. 14 is a diagram for explaining the method of manufacturing the semiconductor device according to the first embodiment.
Figure 15:
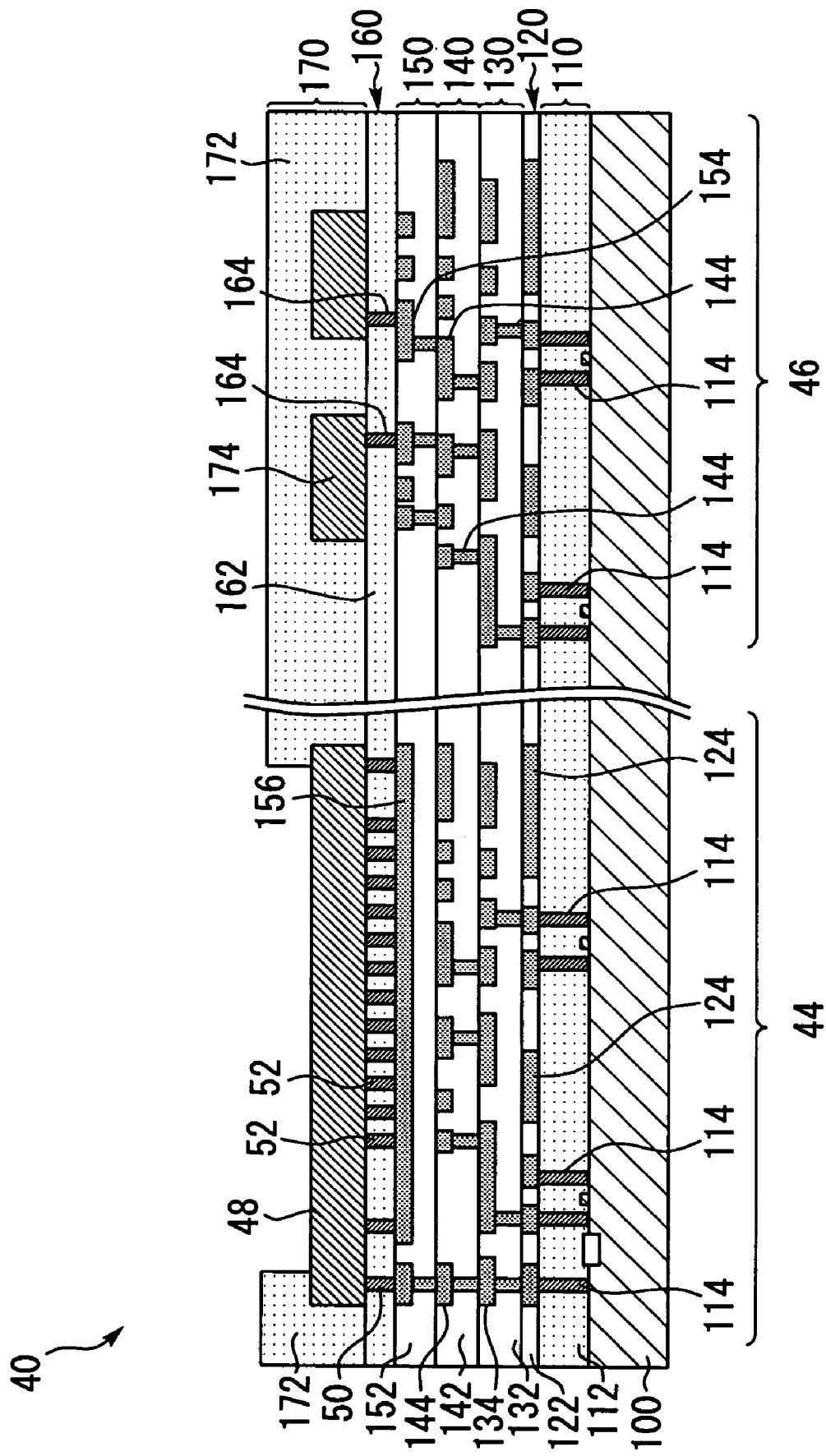
FIG. 15 is a diagram for explaining the method of manufacturing the semiconductor device according to the first embodiment.

Thereafter, tungsten is buried in the openings formed in the interlayer insulating film 162, the resist is removed, and the sixth wiring layer 160 is formed (FIG. 14). Thereafter, the pad 48 and the wiring 174 are further formed, and the uppermost layer is covered with the insulating layer 172 while the pad 48 is exposed. Thereby, the uppermost layer 170 is formed, and the semiconductor device 40 is formed (FIG. 15).

Figure 16:
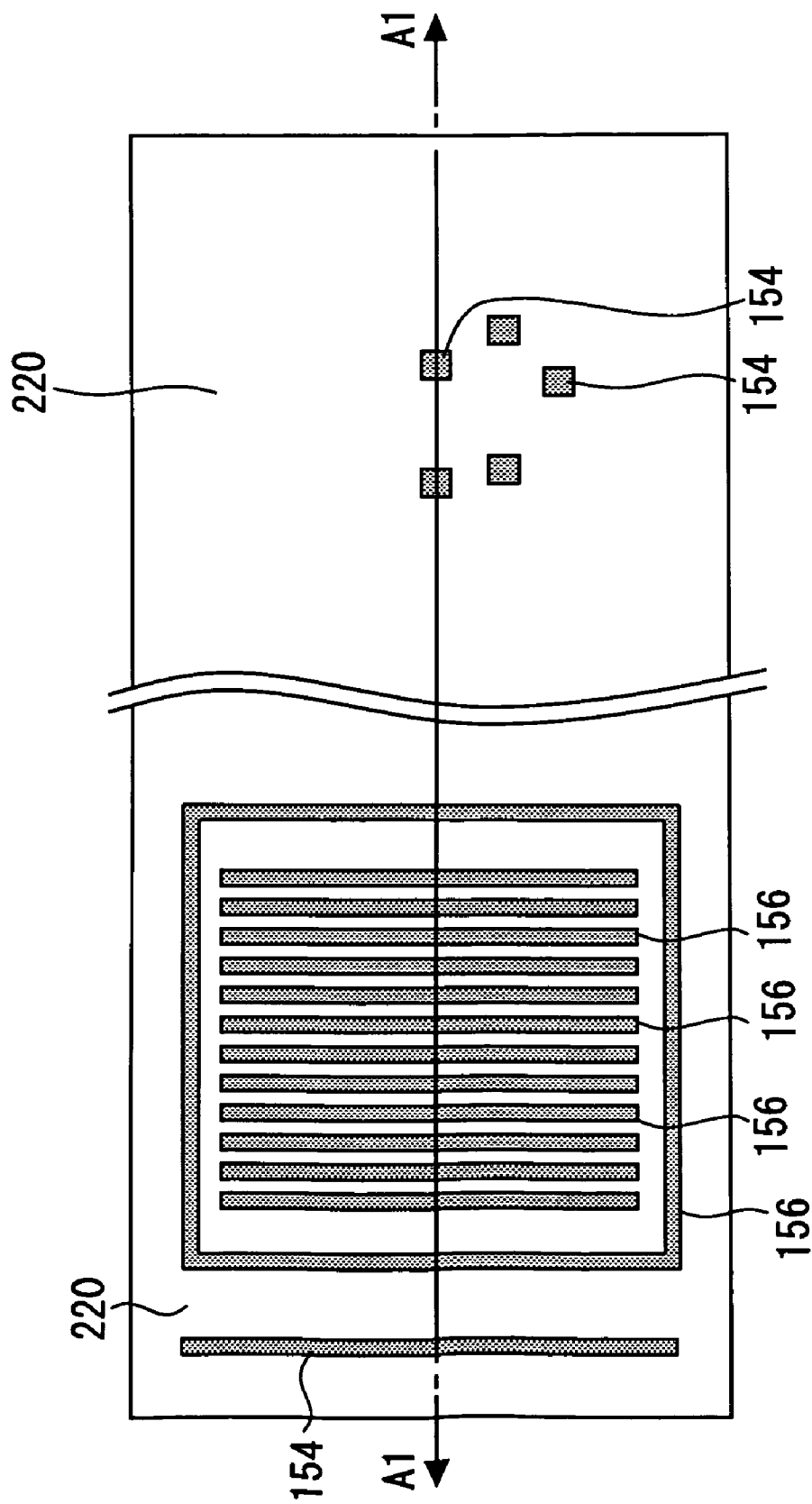
FIG. 16 is a diagram for explaining the method of manufacturing the semiconductor device according to the first embodiment.
Figure 17:
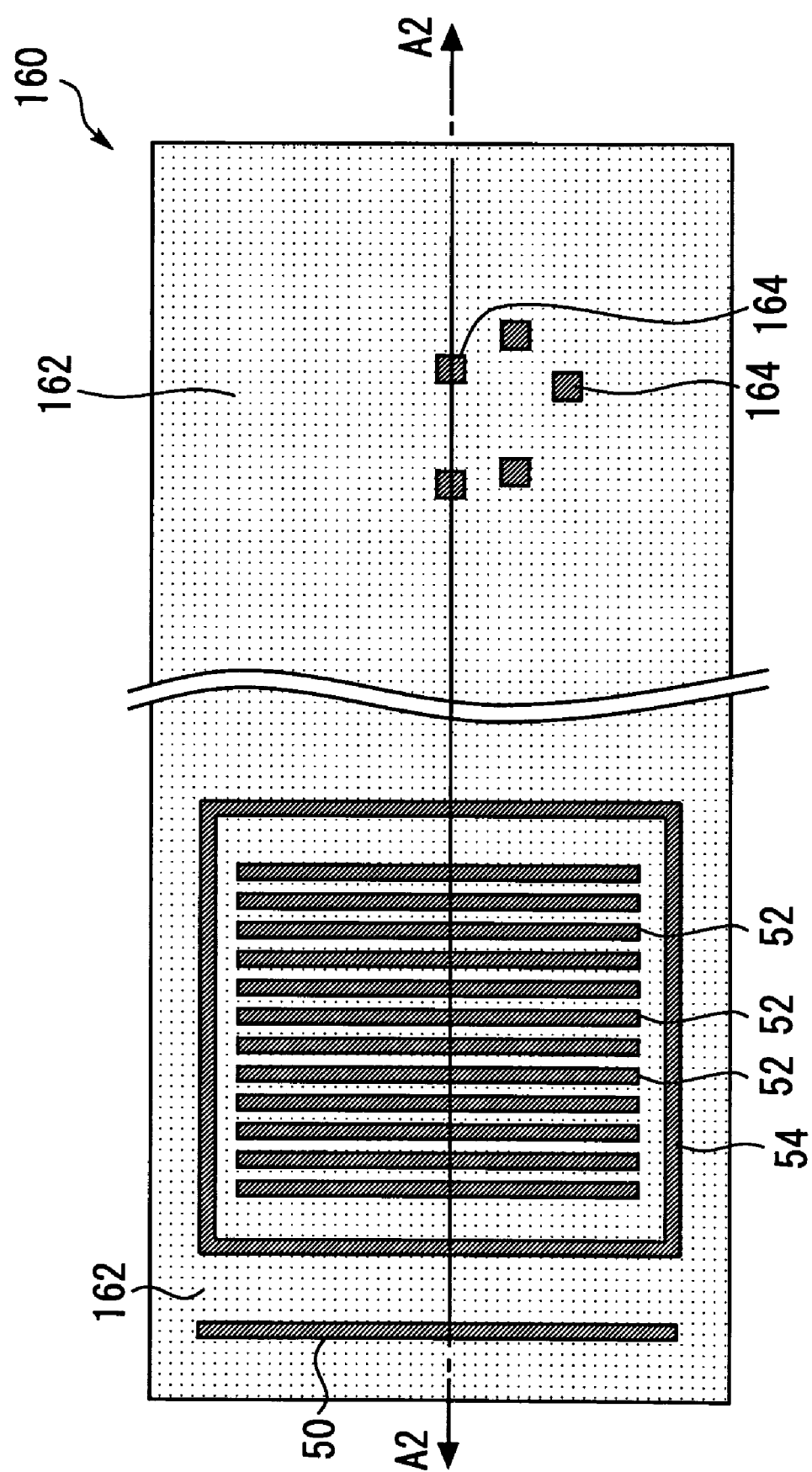
FIG. 17 is a diagram for explaining the method of manufacturing the semiconductor device according to the first embodiment.
Figure 18:
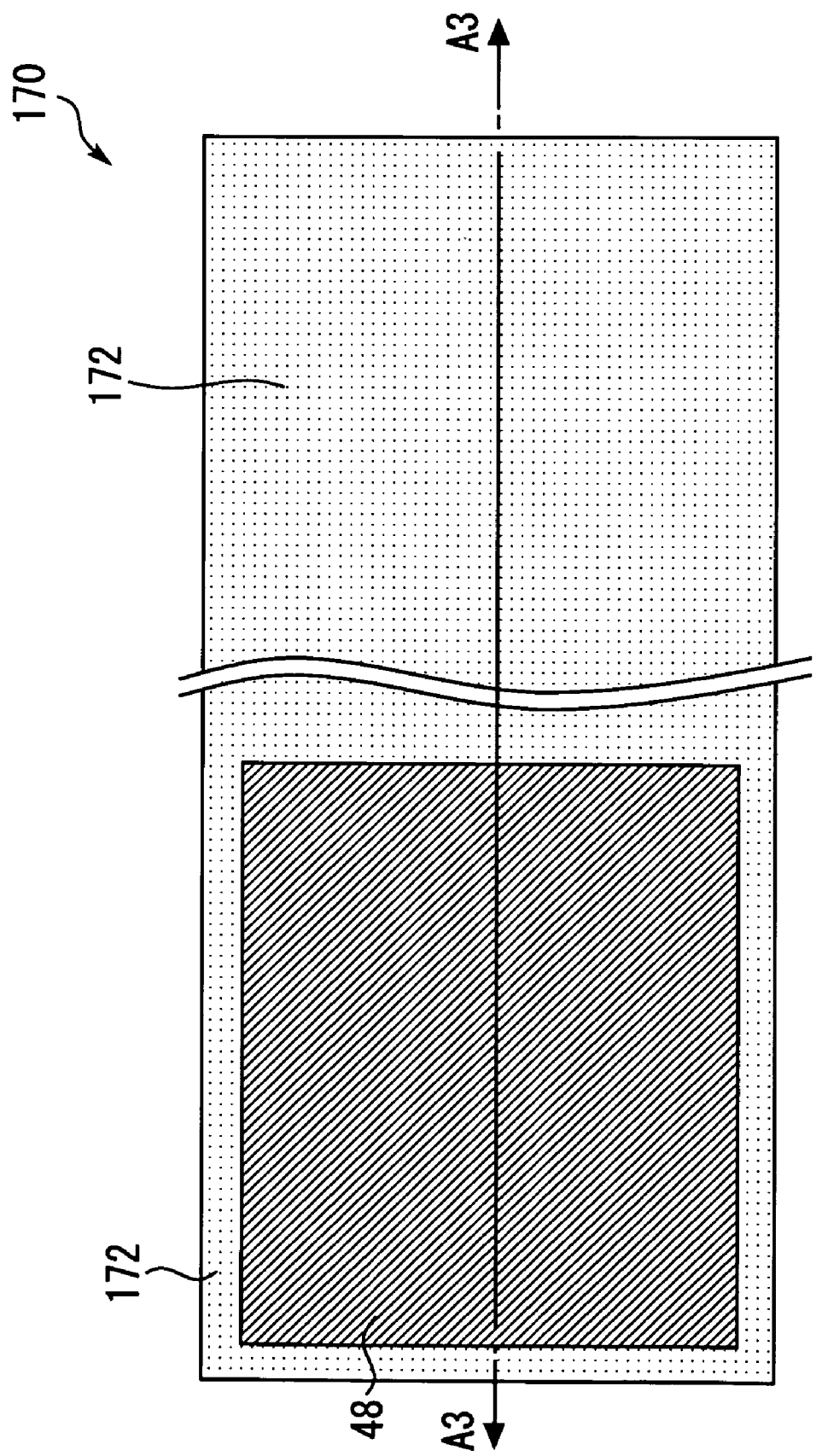
FIG. 18 is a diagram for explaining the method of manufacturing the semiconductor device according to the first embodiment.

FIGS. 16 to 18 are plan views in the manufacturing process of the above described semiconductor device 40. FIG. 16 is a plan view of the state in FIG. 13, and a section along line A1-A1 in FIG. 16 corresponds to FIG. 13. FIG. 17 is a plan view of the state of FIG. 14, and a section along line A2-A2 in FIG. 17 corresponds to FIG. 14. FIG. 18 is a plan view of the state of FIG. 15, and a section along line A3-A3 in FIG. 18 corresponds to FIG. 15.

Thereafter, inspection is performed for the semiconductor device 40 completed by the above described steps (not illustrated). In this step, inspection is performed by carrying out probing into the pad 48 of the semiconductor device 40. The semiconductor device 40 includes the reinforcing wirings 52 in the layer under the pad 48, and therefore, resistance against an impact by probing is enhanced. After this step, the probe mark 60 remains in the pad 48 as shown in FIG. 4.

Figure 19:
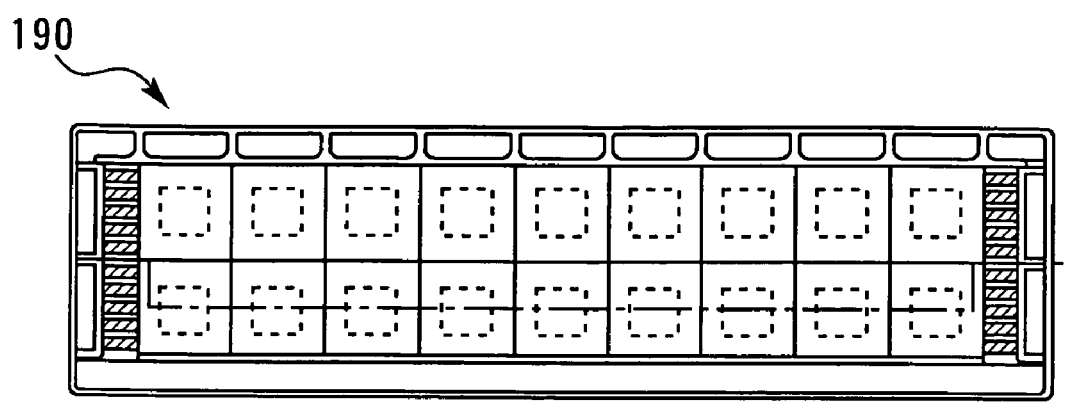
FIG. 19 is a plan view of a wiring board of the first embodiment.
Figure 20:
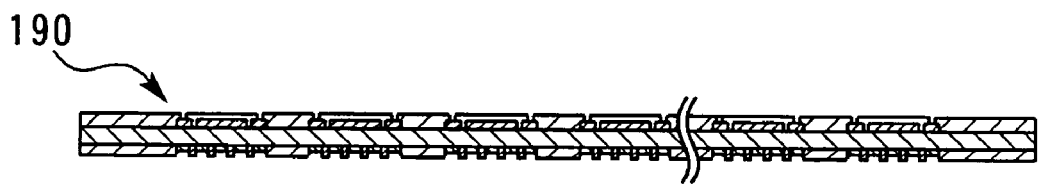
FIG. 20 is a sectional view of a wiring board of the first embodiment.

Next, a mounting step of the semiconductor device 40 described above will be described by using FIGS. 19 to 24. For convenience of explanation, the semiconductor device 40 is shown by being simplified in FIGS. 19 to 24. In order to assemble the semiconductor device 40, a wiring board 190 formed by an organic resin such as an epoxy resin is prepared first as illustrated in FIG. 19 (plan view) and FIG. 20 (sectional view). Next, the wiring board 190 is thermally treated at a temperature of 200° C. for 30 seconds to reduce moisture absorptivity, and prebake for removing a remaining solvent is performed.

Figure 21:
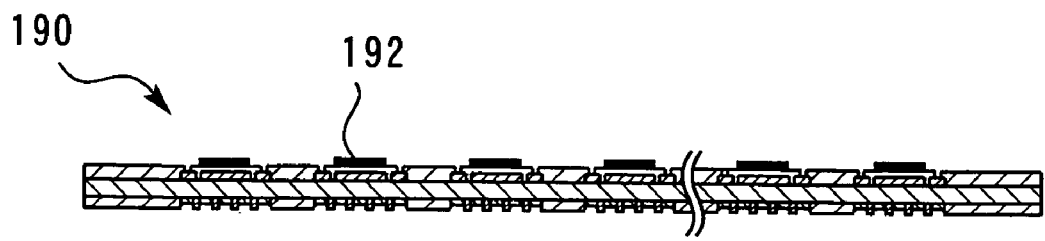
FIG. 21 is a sectional view of a state after a die bond film is bonded on a wiring board.

Next, as shown in FIG. 21, a die bond film 192 is bonded on the prebaked wiring board 190 at a temperature of 120 to 190° C. Next, the film is thermally treated at a temperature of 120 to 250° C. for about 2 to 20 minutes to promote shrinkage on curing of the die bond film. Thereby, when voids occur between the surface of the wiring board 190 and the die bond film 192, the voids can be reduced by pushing out the voids.

Figure 22:
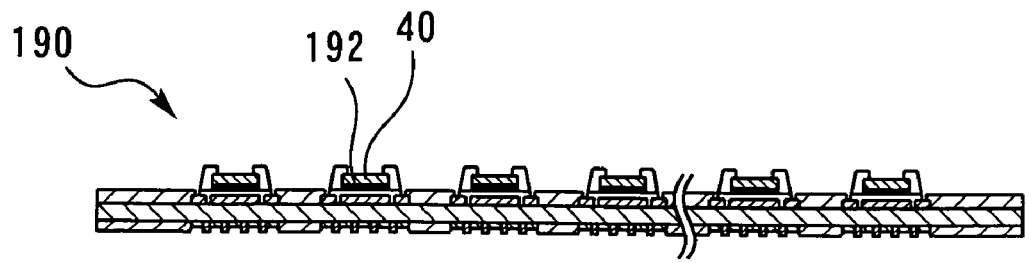
FIG. 22 shows a state after the semiconductor device is wire-bonded to a wiring board.
Figure 23:
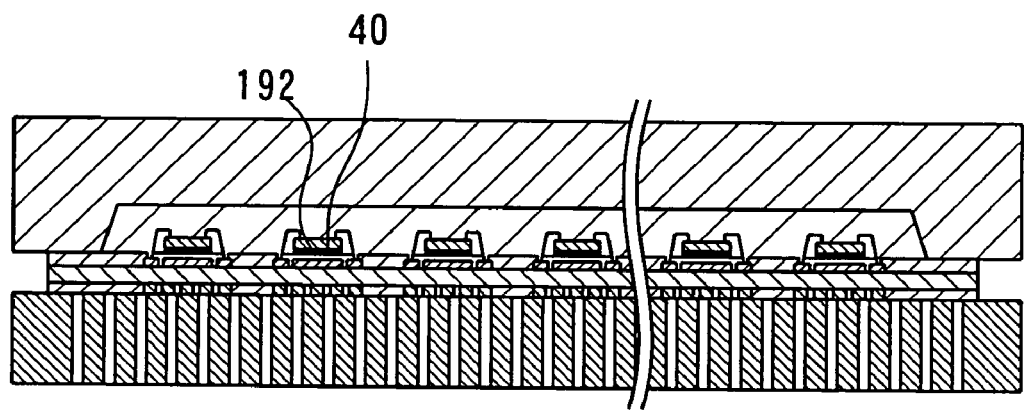
FIG. 23 shows a state after a resin sealing is performed to the semiconductor device.
Figure 24:
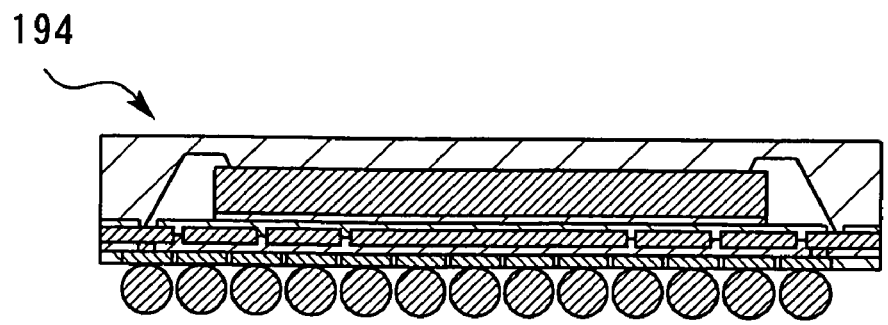
FIG. 24 shows a completed semiconductor package according to the first embodiment.

Next, the semiconductor device 40 is mounted on the die bond film 192. At this time, heat at about 150 to 250° C. is applied to the semiconductor device 40. Next, a resin for performing die-bonding is cured at a temperature of 150 to 250° C. Next, as shown in FIG. 22, wire bonding is performed. Though not illustrated, at the time of this step, wire bonding is applied to the pad 48 of the semiconductor device 40. At this time, a temperature of about 130 to 180° C. is applied to the semiconductor device 40. Next, as shown in FIG. 23, resin sealing is performed. At this time, a temperature of about 150 to 200° C. is applied to the semiconductor device 40. Next, on the electrode on the back surface of the wiring board 190, solder balls to be external terminals are formed, and after being separated into pieces, marked, and subjected to the final test, a semiconductor package 194 which is completed as shown in FIG. 24 is shipped.

As described above, according to the first embodiment, the wirings of the layer under the pad are formed with the normal mask, at the time of forming the pad 48. Therefore, photolithography can be performed without providing a mask overlapping margin in the mask for forming the wirings of the layer under the pad. Accordingly, miniaturization of the pad 48 can be performed without being inhibited by the limitation of the mask overlapping margin.

According to the first embodiment, the reinforcing wiring 52 is in a linear pattern. As already described, it is known that a linear pattern is effective as the pattern of the reinforcing wirings. Therefore, according to the first embodiment, miniaturization can be realized while obtaining a high reinforcing effect. Further, the linear pattern is formed by the normal mask in this embodiment, and therefore, the above described effect can be obtained without worrying about the harmful effect such as occurrence of a sub peak at the time of using a halftone mask.

According to the first embodiment, the wirings (the wiring 50, the reinforcing wirings 52 and the reinforcing annular wiring 54) in the layer under the pad are formed by photolithography by the normal photomask, while those at the side of the further lower layers (the fifth to the first wiring layers) are formed by photolithography by the halftone masks. Thereby, the kinds of photomasks are properly used effectively in the entire semiconductor device, and miniaturization of the semiconductor device can be carried out comprehensively.

In this embodiment, a low dielectric constant film is used for the interlayer insulating films of the second to the fifth wiring layers. Low dielectric constant films are generally low in density as compared with $SiO_2$ films. Depending on the kinds of films, there are films in a porous form, and such films themselves are fragile due to high voids rates. Accordingly, they are structurally weak, and also have weak adhesion force in the interface with the $SiO_2$ films. In such a staking structure, it is especially desirable to apply reinforcement under the pad. In this respect, according to this embodiment, miniaturization can be achieved while the reinforcing wirings under the pad are secured, and therefore, when miniaturization of the structure using a low dielectric constant film in the vicinity of the pad is achieved, an extremely excellent effect can be exhibited.

In this embodiment, the diameters of the plug wirings of the lower wiring layers are set to be not more than the wavelength of the light source in the photolithography step. As described in the explanation of FIG. 6, the width of the light transmission pattern for forming the wirings of the layer under the pad is set to be not more than the wavelength of the light source in the photolithography step. By this, the photolithography step can be performed more effectively.

Modified Example of the First Embodiment

First Modified Example

In the first embodiment, the wirings of the portion under the pad of the sixth wiring layer 160 are formed by using a normal photomask. The wirings of the other parts are formed by using a halftone mask. However, the present invention is not limited to this. For the wirings except for those in the portion under the pad, a normal photomask and a phase shift mask can be properly used. For example, photolithography may be performed by using normal masks for all the wiring layers of the I/O cell region 44, and photolithography may be performed by using phase shift masks for all the wiring layers of the core circuit region 46.

Photolithography may be performed respectively for the first to the fifth wiring layers by using normal photomasks, for the wirings of the portion under the pad in the sixth wiring layer by using a normal photomask, and for the wirings of the core circuit region in the sixth wiring layer by using phase shift masks. Specifically, based on the idea of this embodiment, if only a normal photomask is used for at least the wiring layer at the portion under the pad, the wirings of the other portions can be formed by properly using phase shift masks and normal photomasks.

In the first embodiment, the core circuit region 46 and the I/O cell region 44 (wirings of the layer under the pad 48) are formed by providing the halftone mask region and the normal photomask region in the mask 202. However, the present invention is not limited to this. The normal photomask provided with the pattern of the wirings of the layer under the pad 48, and the photomask for the core circuit region (properly selectable from the normal photomask, phase shift mask and the like) may be individually prepared.

Second Modified Example

In the first embodiment, the reinforcing wiring 52 is in the slit-shaped pattern. However, the present invention is not limited to only this structure. Preferable patterns are properly used for the reinforcing wirings of the layer under the pad, and the reinforcing wirings can be formed by using a normal photomask. Specifically, various reinforcing wirings which are disclosed in the ideas described in the known documents cited above can be selected. As the reinforcing wiring, the pattern occupation ratio is preferably set to be high as described above. With respect to the region with a high pattern occupation ratio, occurrence of a sub peak can be effectively prevented by using a normal photomask.

Third Modified Example

In the first embodiment, the SiOC film is used as a low dielectric constant film (Low-k film) for some of the interlayer insulating films. However, the present invention is not limited to this in any way. Low dielectric constant films include an SiOF film, an SiLK film, an SiCN film, an $SiO_2$ film containing a methyl group, MSQ (Methyl Silses Quioxane) and the like in addition to an SiOC film. These low dielectric constant films are films with relative dielectric constants lower than that of an $SiO_2$ film (relative dielectric constant of about 3.9 to 4). The lower wiring layers may be formed by using these low dielectric constant films as the interlayer insulating films. These low dielectric constant films do not always have to be used.

Fourth Modified Example

In the first embodiment, the diameters of the plug wirings of the lower wiring layers and the widths of the light transmission patterns for forming the wirings of the layer under the pad are set to be not more than the wavelengths of the light sources in the respective photolithography steps. However, the present invention is not limited to this, and the dimensions of them do not always have to be not more than the wavelengths of the light sources. Preferable diameters and widths can be properly adopted in accordance with necessity.

Fifth Modified Example

Figure 25:
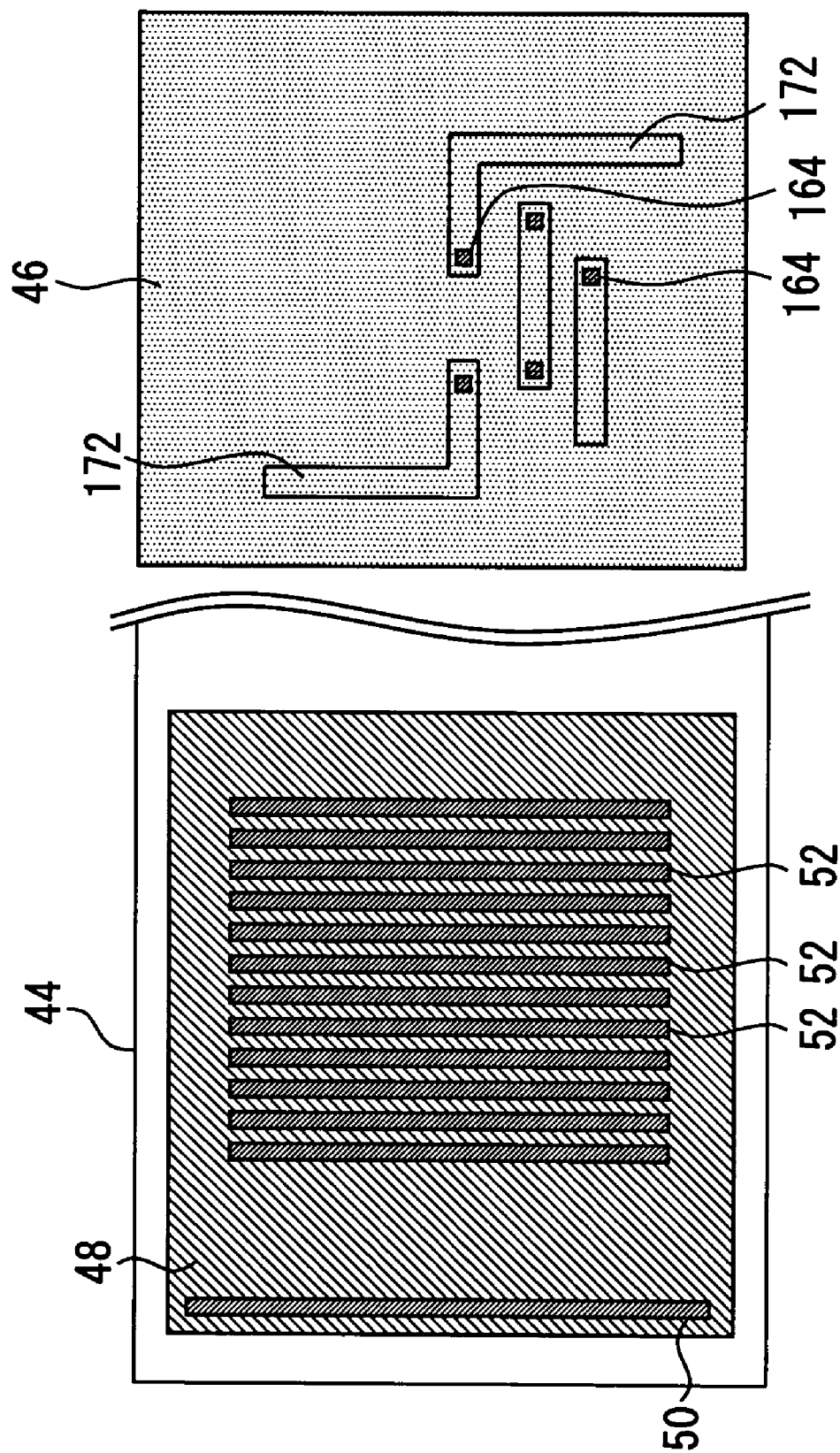
FIG. 25 shows a modified example of The first embodiment.

In the first embodiment, the annular wiring (reinforcing annular wiring 54) is provided as the reinforcing wiring. In the fifth wiring layer, the wiring 156 constituted of Cu is provided as a solid pattern. However, the present invention is not limited to this. Either one of the reinforcing annular wiring 54 or the wiring 156, or both of them may be omitted. FIG. 25 is an enlarged plan view of the vicinity of the pad of the semiconductor device according to the fifth modified example. FIG. 25 is a view corresponding to FIG. 3 in the semiconductor device 40 of the first embodiment. As in FIG. 25, reinforcement may be performed with only the reinforcing wirings 52.

Though not illustrated, when the wiring 156 is omitted, the interlayer insulating film 152 is directly located below the reinforcing wirings 52. Specifically, for example, when the step in FIG. 13 is performed for the semiconductor device which does not include the wiring 156, the wirings 154 are exposed from some of the openings, and the interlayer insulating film 152 is exposed from the other openings. Though there is such a difference in step, the idea of forming the wiring of the layer under the pad by using a normal photomask is similarly applied, and the same effect as that of the first embodiment can be obtained.

In the first embodiment, the semiconductor device is packaged by applying wire bonding to the pad 48 (FIGS. 19 to 24). However, the present invention is not limited to this. A bump may be provided at the pad 48, and connection with the external substrate may be performed via the bump. The circuit configuration and the wiring structure of the first embodiment can be properly changed. In other words, the idea of the present invention can be properly used for the semiconductor devices including other circuit configurations and wiring structures.

The features and advantages of the first embodiment may be summarized as follows: the wiring of a portion under the pad is formed by photolithography using a normal photomask, and thereby, a demand for reinforcement of the pad and a demand for miniaturization of the structure in the vicinity of the pad can be effectively made compatible.

Second Embodiment

Hereinafter, a second embodiment of the present invention will be described by using FIGS. 26 to 36. A semiconductor device according to the second embodiment has the structure common to the first embodiment as will be described later. More specifically, the semiconductor device according to the second embodiment includes therein circuits similar to the circuits of the first embodiment (FIG. 1). The shape of the device surface is similar to the device surface structure (FIG. 2) of the first embodiment. Therefore, illustration and explanation will be omitted with regard to the circuit configuration and the surface structure, and the part in the second embodiment which especially differs from the first embodiment will be described in detail hereinafter.

Figure 26:
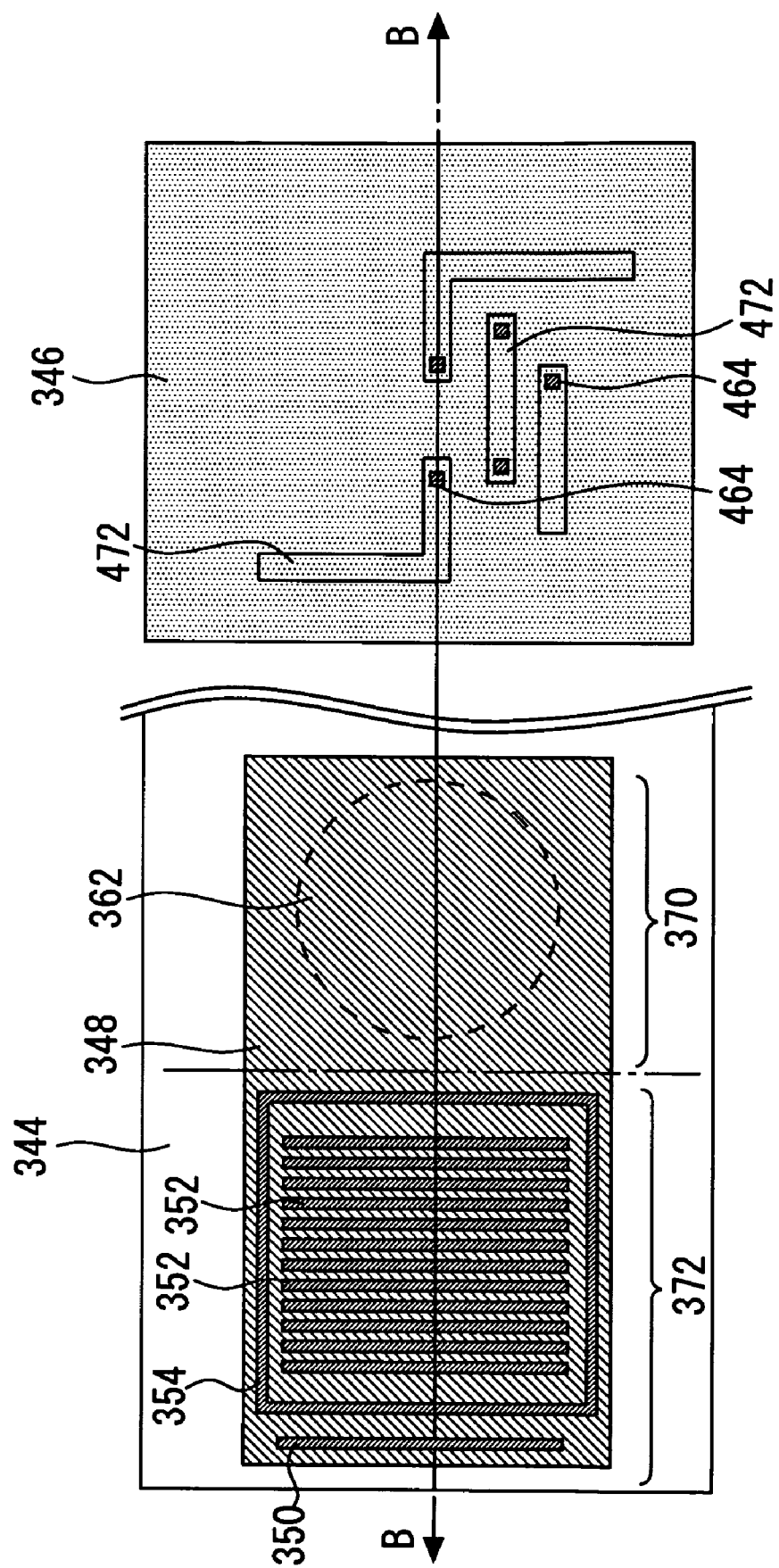
FIG. 26 is a schematic view explaining the surface structure of a semiconductor device according to a second embodiment.

FIG. 26 is a plan view showing a pad 348 and a core circuit region 346 of the semiconductor device of the second embodiment by partially enlarging them. FIG. 26 is a view corresponding to FIG. 3 of the first embodiment. The pad 348 is included in an I/O cell region 344. Comparing FIG. 26 and FIG. 3, the pad of the semiconductor device of second embodiment is in the shape horizontally longer than that of the device of the first embodiment.

FIG. 26 shows a wiring structure of the layer under the pad through the pad for convenience as in FIG. 3. In the semiconductor device of the second embodiment, the pad 348 is divided into a probing region 372 and an external connection region 370. The probing region 372 is a region which a probe for inspection contacts, in the pad 348. The external connection region 370 is a part in which wire bonding or bump formation is performed when packaging the semiconductor device. The portion shown by the circle of the broken line in the external connection region 370 shows the position in which wire bonding is performed, for convenience (hereinafter, the circle will be also called a bonding position 362). Though this part is encircled by the broken line in FIG. 26, the part is actually one part of the surface of the pad 348, and does not have any visual distinction from the other part of the surface.

In the portion under the probing region 370 of the pad 348, a wiring 350, reinforcing wirings 352 and a reinforcing annular wiring 354 are included. These wirings correspond to the wiring 50, the reinforcing wirings 52 and the reinforcing annular wiring 54 in the first embodiment respectively. In the core circuit region 346, wirings 472 and plug wirings 464 are included. These wirings correspond to the wirings 172 and the plug wirings 164 of the first embodiment respectively.

Figure 27:
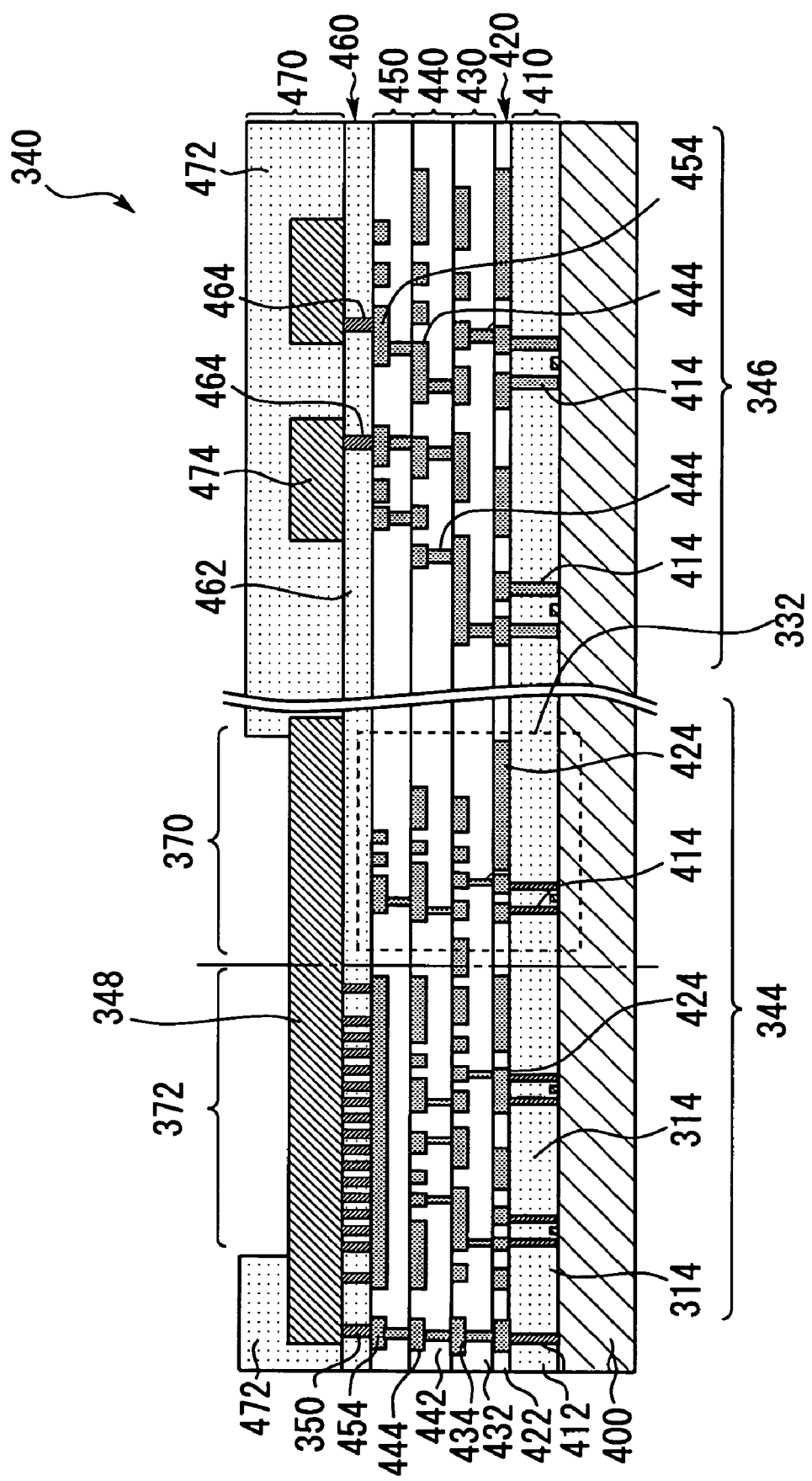
FIG. 27 is a sectional view taken along line B-B in the semiconductor device of the second embodiment.
Figure 28:
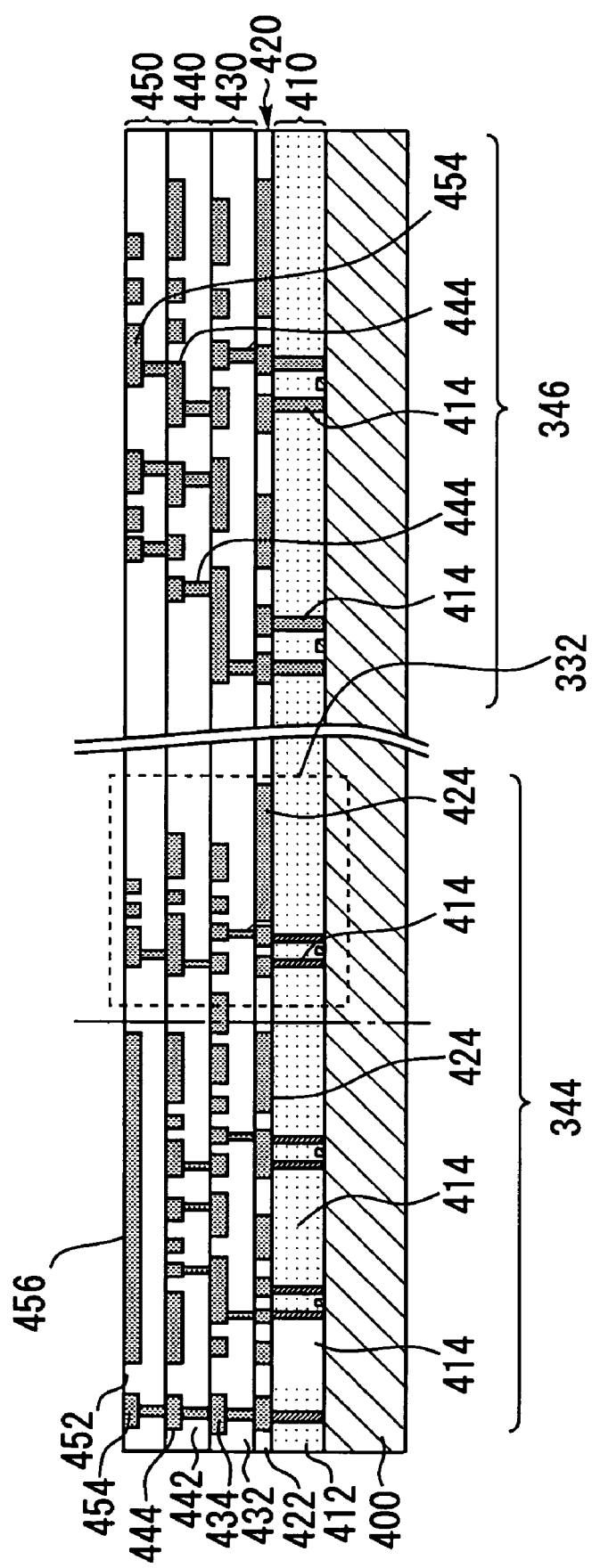
FIG. 28 is a diagram for explaining a method of manufacturing the semiconductor device according to the second embodiment.

FIG. 27 is a view showing a sectional view of a semiconductor device 340 of the second embodiment. FIG. 27 is a sectional view taken along line B-B in FIG. 26. FIG. 27 is a view corresponding to the sectional view of FIG. 4 of the first embodiment. FIG. 27 partially shows the section of the I/O cell region 344 and the section of the core circuit region 346, of the structure of the semiconductor device 340. The core circuit region 346 has the same structure as the core circuit region 44 in the semiconductor device 40 of the first embodiment.

Meanwhile, the I/O cell region 344 has a structure different from the I/O cell region 44 of the first embodiment. More specifically, as shown in FIG. 27, the I/O cell region 344 is divided into the probing region 372 side and the external connection region 370 side.

The external connection region 370 includes a level shift circuit wiring 332. More specifically, in the second embodiment, the level shift circuit wiring 332 is provided in the region below the external connection region 370, that is, the region below the side in which the reinforcing wirings 352 are not provided, in the pad 348. The level shift circuit wiring 332 is a wiring constituting the level shift circuits 32 and 34 shown in the circuit diagram in FIG. 1.

As described above, the semiconductor device of the second embodiment includes therein the same circuits as in FIG. 1. By adopting a latch type circuit as shown in the circuit diagram in FIG. 1, the amplitude of the voltage between the source/drain of PMOS can be secured even with a low input voltage. Thereby, power consumption by feed-through current can be suppressed to the minimum.

The semiconductor device 340 in FIG. 27 is constituted by stacking a first wiring layer 410, a second wiring layer 420, a third wiring layer 430, a fourth wiring layer 440, a fifth wiring layer 450, a sixth wiring layer 460 and an uppermost layer 470 on a semiconductor substrate 400 in sequence. These layers are layers constituted by forming wirings 414, 424, 434, 444, 454, 456 and 464 in interlayer insulating films 412, 422, 432, 442, 452 and 462. The structures, the materials and the like of the first to the sixth wiring layers and the uppermost layer are substantially the same as those of the semiconductor device 40 of the first embodiment. Therefore, the explanation of them will be omitted.

Hereinafter, the characteristics and effect of the semiconductor device of the second embodiment will be described.

As described above, the pad 348 of the semiconductor device 340 of the second embodiment has the constitution in which the pad 348 is extended outside from the region where the reinforcing wirings are located as compared with the pad 48 of the first embodiment. The surface of the pad 348 is divided into two regions that are the region corresponding to the reinforcing wirings and the external connection surface 362.

A mechanical force applied to the pad and the structure in the vicinity of the pad include a force exerted at the time of contact of an inspecting probe and a force exerted at the time of forming external connection such as wire bonding or bump connection. When probing is repeatedly performed in the inspection step, damage to the pad becomes large. Due to this, pad removal is highly likely to be caused when bonding is applied to the damaged pad.

Thus, in the second embodiment, division is made between the probing region 372 and the external connection region 370 on the pad 348. Specifically, the probing region 372 is provided as the countermeasure against the impact by probing, and the reinforcing wirings 352 are placed in the layer under the region. The structure of the reinforcing wiring 352 is in a slit shape as in the first embodiment. The structure of the reinforcing wiring 352 is not limited to the slit shape, and various patterns can be selected, but the patterns having sufficient occupation ratio are preferable for reinforcing the structure. As the occupation ratio of the reinforcing wirings 352, in the portion where a probe mark 360 is formed, it is preferably at least 40% or more, and is more preferably 50% or more. Apart from this, the external connection region 370 for bonding, bump and the like is provided. By adopting such a constitution, occurrence of pad removal as described above can be suppressed.

Incidentally, of the above described two forces which are applied to the pad, the impact caused by contact of a probe tends to be relatively large, and the force which occurs at the time of forming the external connection wiring tends to be relatively small. Therefore, when these two regions are compared, the same reinforcement is not always required. For example, if the force applied to the external connection region is at such an extent to cause no problem without a reinforcing wiring, selection of providing no reinforcing wiring at the external connection region side is conceivable.

When the reinforcing wirings are provided, some of the layers under the pad are substantially occupied by the reinforcing wirings. For example, even when the pattern occupation ratio of the reinforcing wiring 352 is 50%, the portion in which the pattern is not formed is limited. When the patterns of the slit-shaped reinforcing wirings 352 are arranged, it is practically impossible to make other wiring patterns insulated from the reinforcing wirings 352 in spaces among the reinforcing wirings 352. For example, in FIG. 27, of the lower layers from the pad 348 in the probing region 372, most parts of the sixth wiring layer 460 and the fifth wiring layer 450 are used for the reinforcing wirings. Meanwhile, as miniaturization of the semiconductor device advances, a demand for effective use of a space of the layers under the pad (like the PAA structure) is growing. Especially, when the latch type circuit as shown in the circuit diagram of FIG. 1 is adopted, the circuit configuration tends to be complicated. Therefore, securement of the degree of freedom of wirings becomes essential, and there arises a demand for using as many layers as possible of the wiring layers under the pad for running wirings.

Thus, in this embodiment, the reinforcing wirings are not provided in the lower layer of the external connection region 370 though the reinforcing wirings are provided in the probing region 372, and instead, the space is utilized for running wirings. Specifically, as shown in FIG. 27, the reinforcing wirings 352 and the like are provided in the layer under the probing region 372, whereas the level shift circuit wiring 332 is provided in the lower layer of the external connection region 370. In doing so, the two functions of high strength and effective use of the space, which are required of the structure of the pad can be made compatible at a high level. This results in contribution to miniaturization of the entire semiconductor device.

Especially in the second embodiment, the level shift circuit wiring is disposed in the layer under the external connection region 370. The level shift circuit is the circuit with relatively complicated running of the wiring, among the circuits located in the region under the pad. Accordingly, a demand for securement of the degree of freedom of running of the wiring is high. In this regard, according to the structure of the second embodiment, a space in the layer under the external connection region 370 is used for running of the level shift circuit, and thereby, the space can be effectively utilized.

Figure 29:
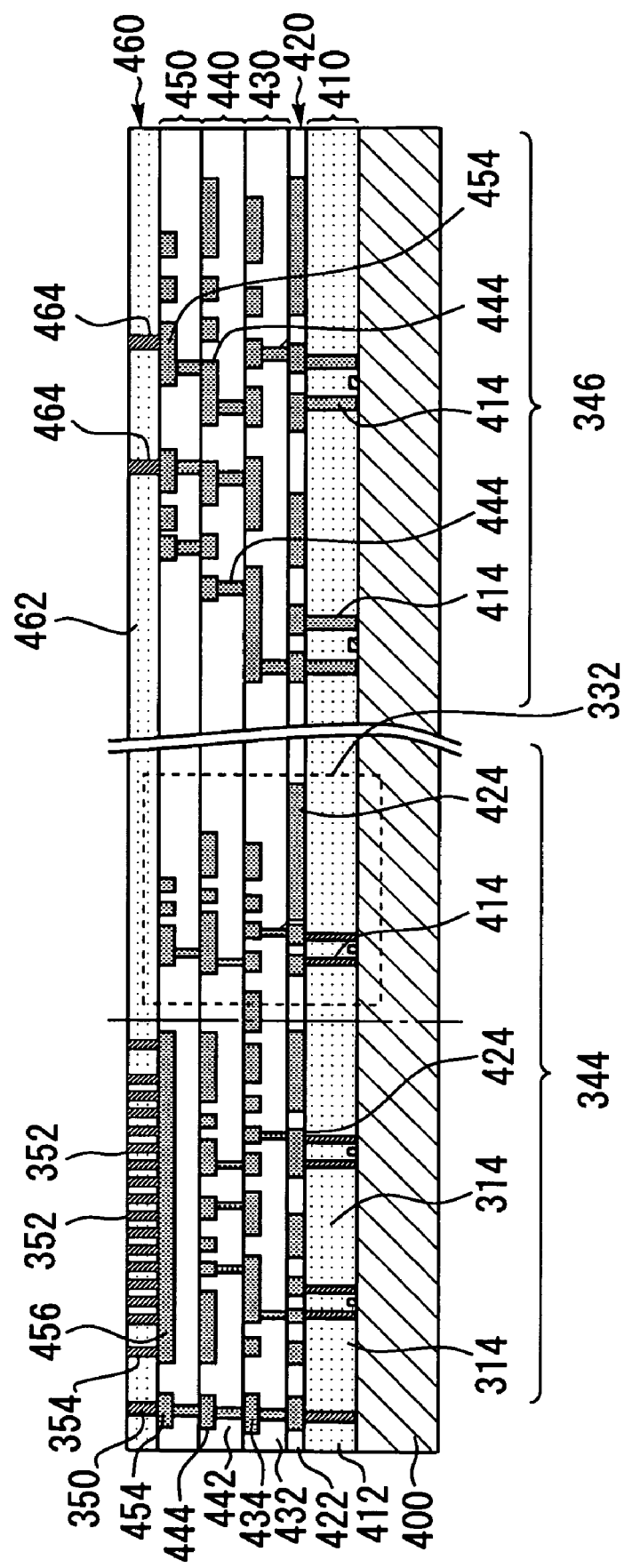
FIG. 29 is a diagram for explaining the method of manufacturing the semiconductor device according to the second embodiment.

Hereinafter, a method of manufacturing the semiconductor device according to the second embodiment will be described by using FIGS. 29 to 36. In this explanation, a method of manufacturing the above described semiconductor device 340 will be described. FIG. 29 is a view showing the stage in which the lower wiring layer is formed in the manufacturing process of the semiconductor device 340. The steps up to FIG. 29 are the same as the steps described by using FIGS. 9 to 14 in the first embodiment except for the point that the level shift circuit wiring 332 is included in each of the wiring layers. With regard to the steps up to FIG. 29, explanation of them will be omitted, since these steps can be realized by using the known multilayer wiring technique.

Figure 30:
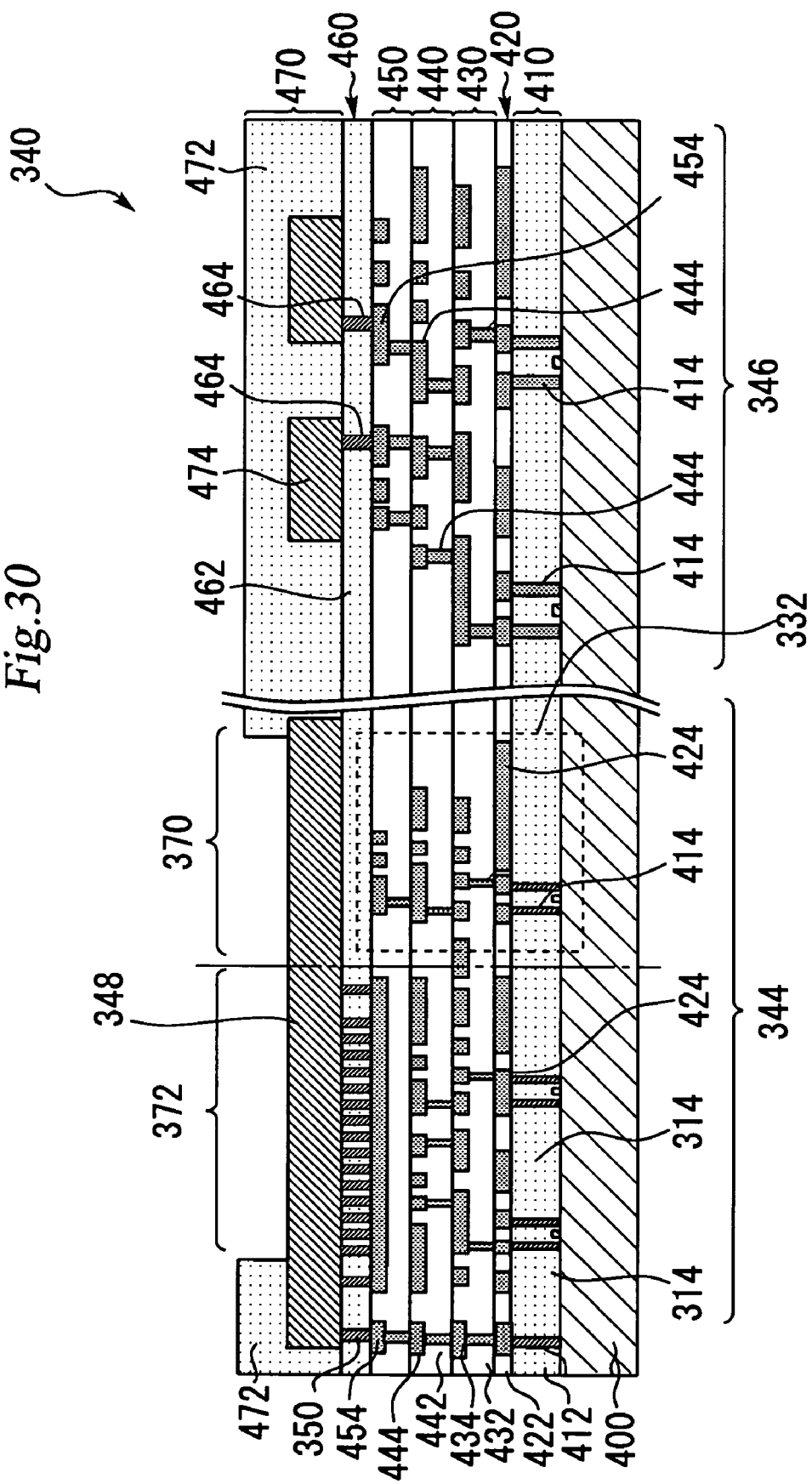
FIG. 30 is a diagram for explaining the method of manufacturing the semiconductor device according to the second embodiment.

FIG. 30 is a view showing the state in which the uppermost layer 470 is stacked on the multilayer wirings in FIG. 29. As shown in FIG. 30, in the second embodiment, the pad 348 is formed to include the region (probing region 372) provided with the reinforcing wirings 52 and the like and extend to the outer portion (above the level shift circuit wiring 332) from the region. The extending part is made the external connection region 370. At this stage, the semiconductor device 340 is completed.

Figure 31:
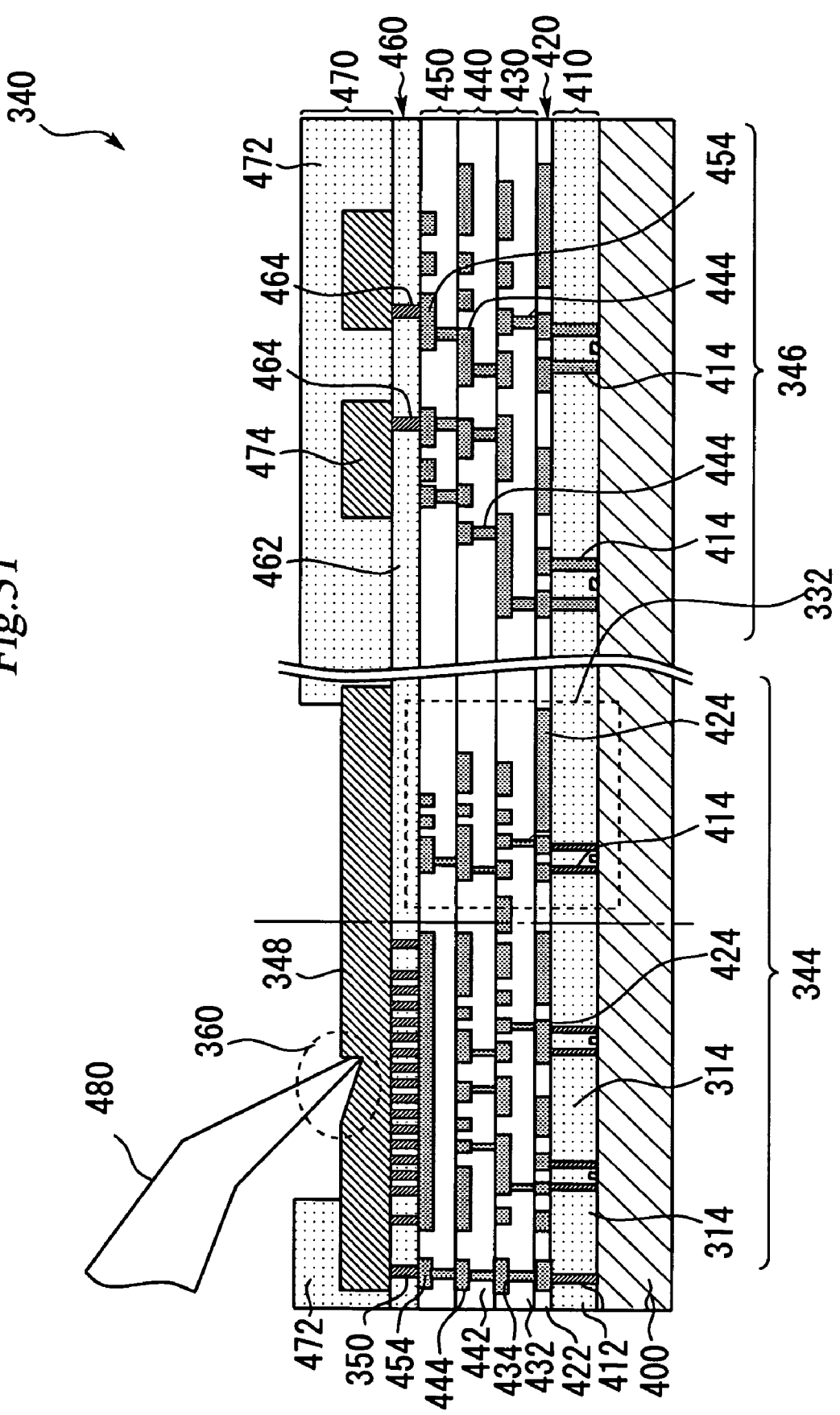
FIG. 31 is a diagram for explaining the method of manufacturing the semiconductor device according to the second embodiment.

Subsequently, an inspecting probe is probed into the semiconductor device 340. FIG. 31 is a view explaining the state at the time of inspection of the semiconductor device 340. An inspecting probe 480 is in contact with the probing region 372 of the pad 348. The inspecting probe 480 is a cantilever type probe of tungsten. A mechanical damage given to the pad by such a probe tends to be relatively large as compared with those of other probes. According to the semiconductor device 340 of this embodiment, such an impact can be reliably handled by the reinforcing wirings 352 and the reinforcing annular wiring 354. When the probing step is carried out, the probe mark 360 occurs to the pad 348.

Figure 32:
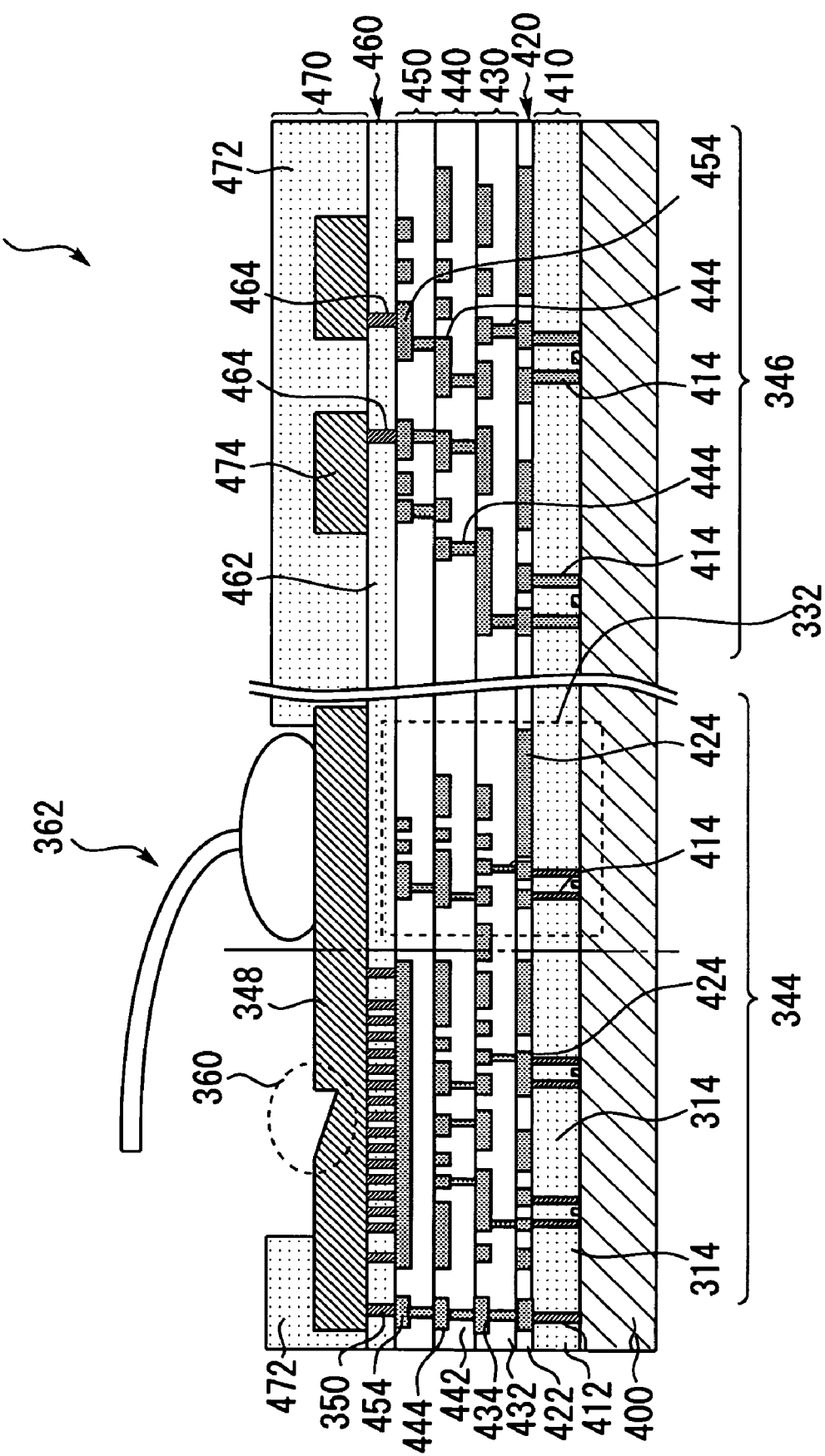
FIG. 32 is a diagram for explaining the method of manufacturing the semiconductor device according to the second embodiment.
Figure 33:
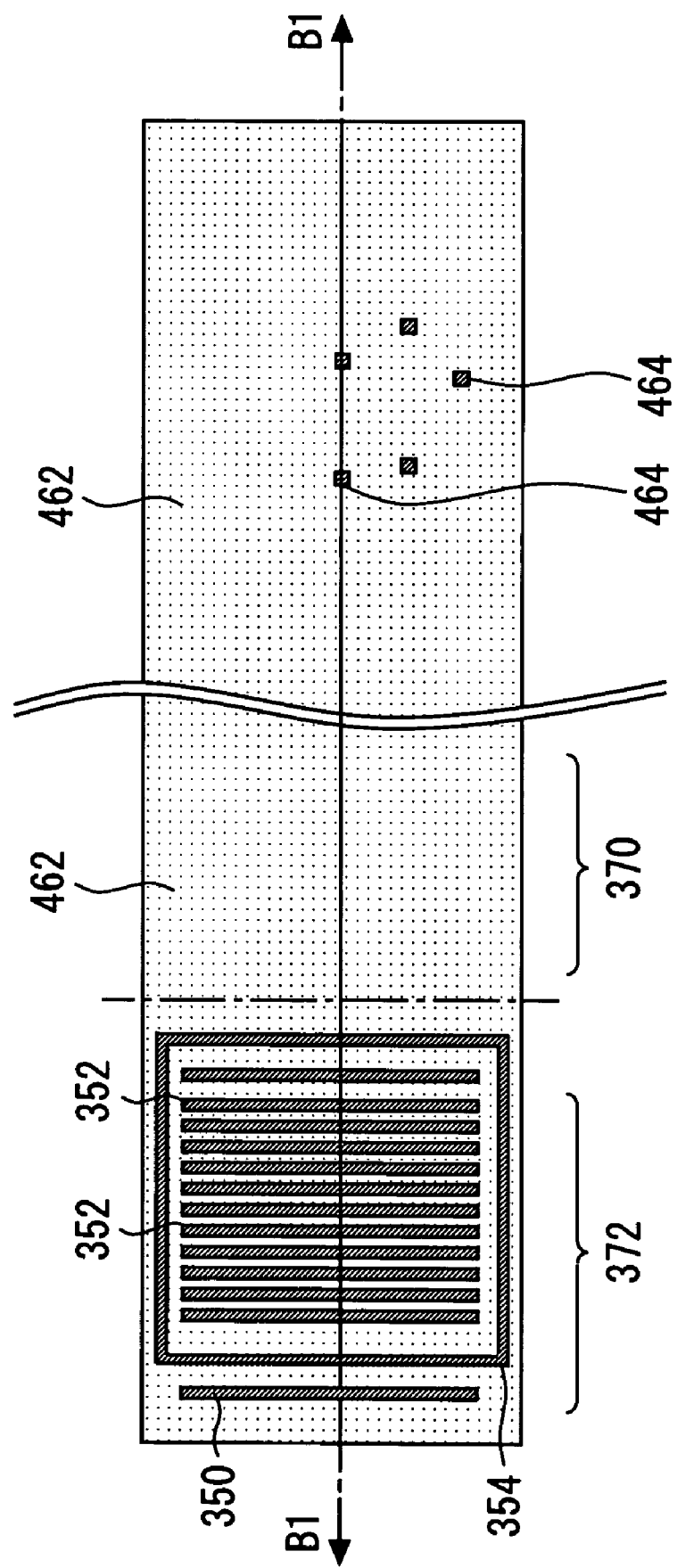
FIG. 33 is a diagram for explaining the method of manufacturing the semiconductor device according to the second embodiment.
Figure 34:
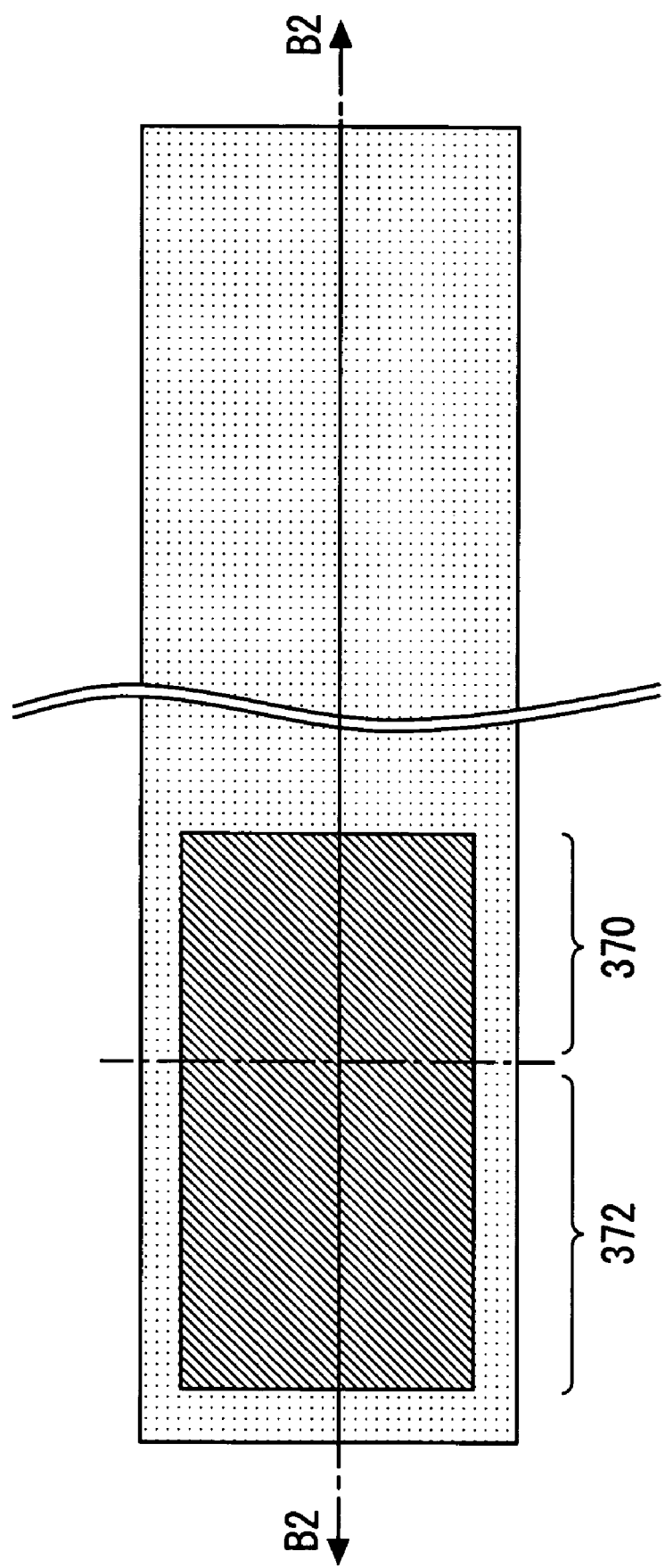
FIG. 34 is a diagram for explaining the method of manufacturing the semiconductor device according to the second embodiment.
Figure 35:
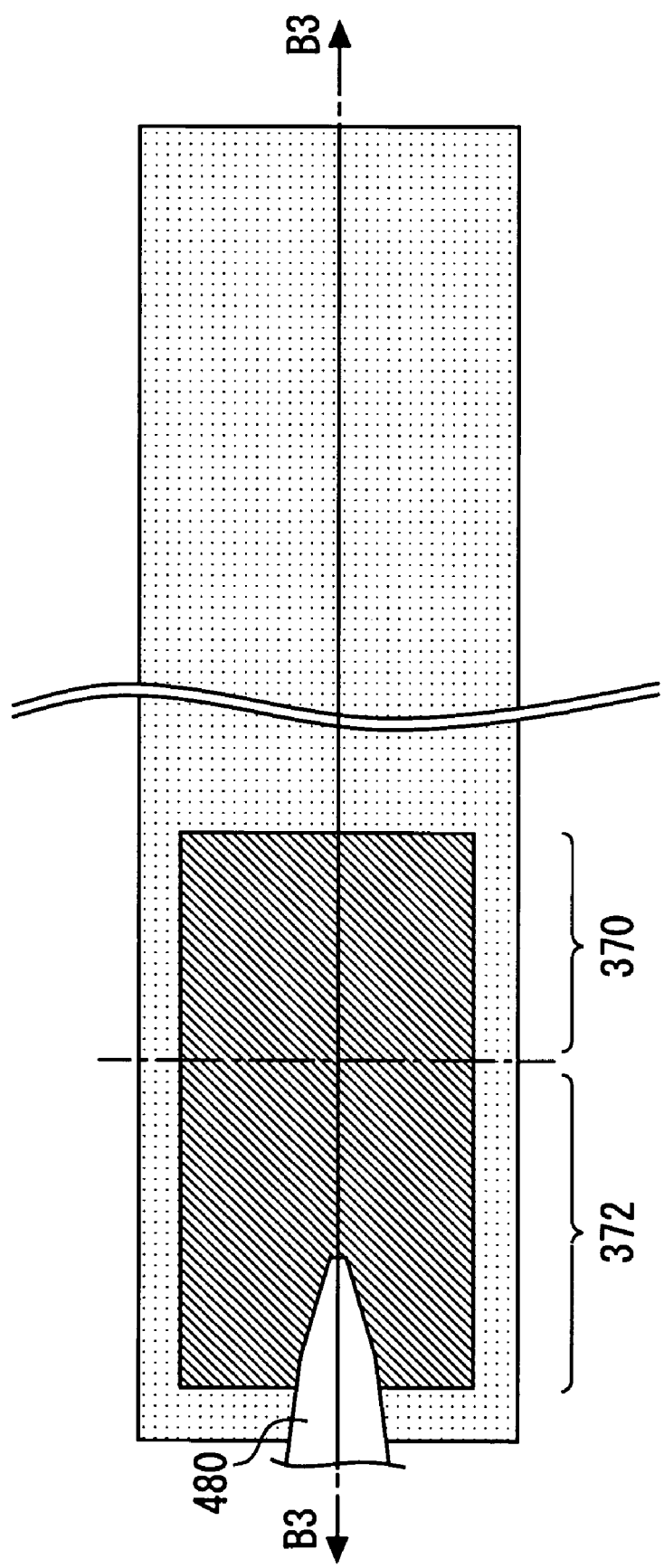
FIG. 35 is a diagram for explaining the method of manufacturing the semiconductor device according to the second embodiment.
Figure 36:
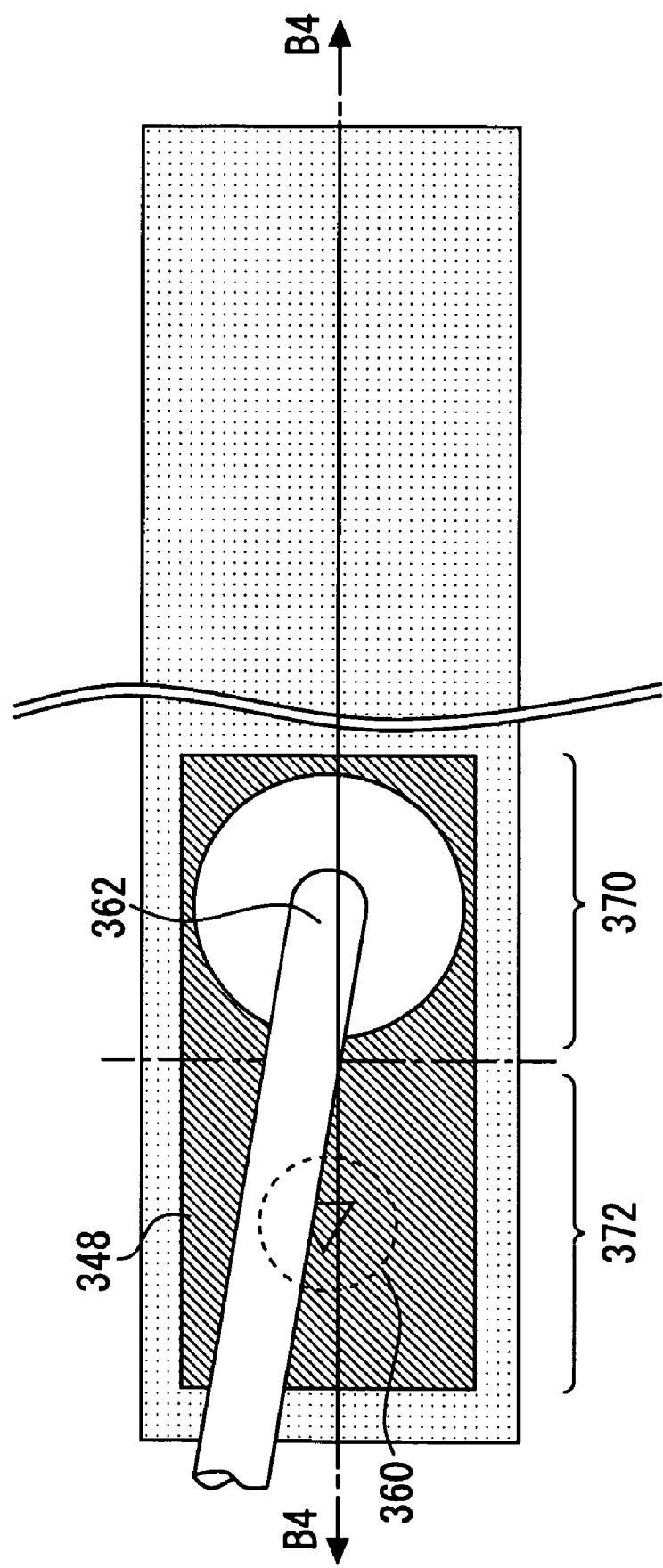
FIG. 36 is a diagram for explaining the method of manufacturing the semiconductor device according to the second embodiment.

After the above described inspection step, the semiconductor device 340 is mounted (packaged) as described in the first embodiment by using FIGS. 19 to 24. FIG. 32 is a view partially showing the state in which wire bonding is applied to the pad 348, of the packaging step. In the second embodiment, wire bonding is performed for the external connection region 370 as shown in FIG. 30. Thereby, a harmful effect such as the aforementioned pad removal can be avoided. FIGS. 33 to 36 are views showing plan views of the above described respective FIGS. 29 to 32. The sectional views taken along lines B1-B1, B2-B2, B3-B3 and B4-B4 in the respective plan views are shown in FIGS. 29 to 32 respectively.

Modified Example of Second Embodiment

First Modified Example

In the second embodiment, the constitution in which the reinforcing wirings are provided in the layer under the probing region 372 and the reinforcing wirings are not provided in the layer under the external connection region 370 is adopted. However, the present invention is not limited to this. The reinforcing wirings may be provided in a part of the space of the layer under the external connection region 370, and a wiring connected to the lower layer wiring may be provided in the remaining part. Specifically, the reinforcing wiring may be provided in a part of the space in the layer under the external connection region 370.

As is already described, an impact caused by contact of the probe tends to be relatively large, whereas the force which occurs at the time of external connection wiring tends to be relatively small. Accordingly, the amount of the reinforcing wiring required of the external connection region 370 is relatively small as compared with the amount of the reinforcing wiring (reinforcement amount) required of the probing region 372. Therefore, wirings are designed so that the ratio ($V_1/V_2$) of "a volume $V_2$ occupied by a non-reinforcing wiring" to "a volume $V_1$ occupied by the reinforcing wiring" in the portion under the pad 348 becomes larger at the portion under the probe region 372 than at the portion under the external connection region 370. Specifically, the amount of wiring is set so as to satisfy the following ratio relation.

$V_1/V_2$ of the external connection region < $V_1/V_2$ of the probing region

Second Modified Example

In the second embodiment, the level shift circuit wiring 332 is disposed in the external connection region 370. However, the present invention is not limited to this. The external connection region 370 can be properly used for running of various circuit wirings. For example, the region can be used for forming the wiring which is a wiring for a power source or ground, and a wiring for reducing resistance.

Third Modified Example

In the manufacturing method of the second embodiment, the cantilever type probe of tungsten is used as the probe for inspection. However, the present invention is not limited to this. Specifically, various other probes, for example, various known probes such as vertical probes typified by a cobra type probe and a thin film probe can be used in the manufacturing process of the second embodiment.

The second embodiment can also adopt the structure in which the reinforcing wirings are formed into the shapes other than the slit shapes, various materials are used for the interlayer insulating films, and the reinforcing annular wiring 354 or the wiring 456 is excluded, as in the modified examples of the first embodiment. The wirings in the layers under the pad of the second embodiment may be formed with only a normal photomask as in the first embodiment, but the present invention is not necessarily limited to this. At the time of forming the wirings of the layers under the pad of the second embodiment, the technique of using the combination of a normal photomask and a halftone mask (for example, the technique in FIG. 5) and the technique of using only a halftone mask (using only a phase shift mask in a broader sense) may be used.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2007-021732, filed on Jan. 31, 2007 including specification, claims, drawings and summary, on which the Convention priority of the present application is based, are incorporated herein by reference in its entirety.

What is claimed is:

1. A method of manufacturing a semiconductor device, comprising the steps of:
preparing a phase shift mask including a predetermined light transmission pattern, and a normal photomask including a predetermined light transmission pattern;
stacking a first wiring layer on a semiconductor substrate, and further stacking, on the first wiring layer, a second wiring layer constituted by including a second wiring which is connected to a wiring of the first wiring layer, and a third wiring which is not connected to the wiring of the first wiring layer;

stacking an interlayer insulating film on said second wiring layer;

forming, in said interlayer insulating film, a first opening in which said second wiring is exposed, and a second opening in which said third wiring is exposed by photolithography using said normal photomask;

burying a metal in said first opening and said second opening; and providing a pad to be overlaid on said first and second openings in which said metal is buried, wherein in said step of stacking said first and second wiring layers, at least some of wirings of the first and second wiring layers are formed by photolithography using said phase shift mask.

2. The method of manufacturing a semiconductor device according to claim 1, wherein said light transmission pattern of said normal photomask includes a plurality of linear light transmission patterns, and said first and second openings are formed by the linear light transmission patterns.

3. The method of manufacturing a semiconductor device according to claim 2, wherein a width of said linear pattern is not more than a wavelength of irradiation light in the photolithography using said normal photomask.

4. The method of manufacturing a semiconductor device according to claim 1, wherein at least part of an interlayer insulating film of said first and second wiring layers and the interlayer insulating film stacked on said second wiring layer is a low dielectric constant film with a relative dielectric constant lower than that of a silicon oxide film.

5. The method of manufacturing a semiconductor device according to claim 1, wherein said wiring formed by photolithography using said phase shift mask includes a wiring having a width not more than a wavelength of irradiation light of the photolithography.

6. The method of manufacturing a semiconductor device according to claim 1, wherein said light transmission pattern of said normal photomask includes an annular light transmission pattern, said step of forming the first and second openings is a step of forming an annular opening with the first and second openings, and the annular opening is formed so as to enclose the second opening.

7. A method of manufacturing a semiconductor device, comprising the steps of:

preparing a phase shift mask including a predetermined light transmission pattern, and a normal photomask including a plurality of predetermined light transmission patterns;

stacking a wiring layer on a semiconductor substrate, and forming at least some of wirings of the wiring layer by photolithography using said phase shift mask;

stacking an interlayer insulating film on said wiring layer;

forming, in said interlayer insulating film, a first opening in which the wiring of said wiring layer is exposed, and a second opening in which the wiring of said wiring layer is not exposed by photolithography using said normal photomask;

burying a metal in said first opening and said second opening; and providing a pad to be overlaid on said first and second openings in which said metal is buried.

8. A method of manufacturing a semiconductor device, comprising the steps of:

preparing a phase shift mask including a predetermined light transmission pattern, and a normal photomask including a predetermined light transmission pattern;

stacking a first wiring layer on a semiconductor substrate, and further stacking, on the first wiring layer, a second wiring layer constituted by including a second wiring which is connected to a wiring of the first wiring layer, and a third wiring which is not connected to the wiring of the first wiring layer;

stacking an interlayer insulating film on said second wiring layer;

forming, in some regions of said interlayer insulating film, a first opening in which said second wiring is exposed, and a second opening in which said third wiring is exposed by photolithography using said normal photomask, and forming, in the other region of the interlayer insulating film, a third opening in which said second wiring is exposed by photolithography using said phase shift mask;

burying a metal in said first, second and third openings; and providing a pad to be overlaid on said first and second openings and not to be overlaid on said third opening, among said first, second and third openings in which said metal is buried.

9. The method of manufacturing a semiconductor device according to claim 8, wherein said light transmission pattern of said normal photomask includes a plurality of linear light transmission patterns, and said first and second openings are formed by using the linear light transmission patterns.

10. The method of manufacturing a semiconductor device according to claim 9, wherein a width of said linear pattern is not more than a wavelength of irradiation light in the photolithography using said normal photomask.

11. The method of manufacturing a semiconductor device according to claim 8, wherein at least part of an interlayer insulating film of said first and second wiring layers and the interlayer insulating film stacked on said second wiring layer is a low dielectric constant film with a relative dielectric constant lower than that of a silicon oxide film.

12. The method of manufacturing a semiconductor device according to claim 8, wherein said wiring formed by photolithography using said phase shift mask includes a wiring having a width not more than a wavelength of irradiation light of the photolithography.

13. The method of manufacturing a semiconductor device according to claim 8, wherein said light transmission pattern of said normal photomask includes an annular light transmission pattern, said step of forming the first and second openings is a step of forming an annular opening with the first and second openings, and the annular opening is formed so as to enclose the second opening.

14. A method of manufacturing a semiconductor device, comprising the steps of:

preparing a phase shift mask provided with a predetermined circuit pattern, and a normal photomask including a plurality of linear light transmission patterns;

stacking a wiring layer on a semiconductor substrate;

stacking an interlayer insulating film on said wiring layer;

forming, in some regions of said interlayer insulting film, a first opening in which a wiring of said wiring layer is exposed, and a second opening in which the wiring is not exposed by photolithography using said normal photomask, and forming, in the other region of the interlayer insulating film, a third opening in which the wiring of said wiring layer is exposed by photolithography using said phase shift mask;

burying a metal in said first, second and third openings;

providing a pad to be overlaid on said first and second openings in which said metal is buried.

* * * * *